US012588233B2

(12) United States Patent
Zhu et al.

(10) Patent No.: US 12,588,233 B2
(45) Date of Patent: Mar. 24, 2026

(54) SEMICONDUCTOR DEVICE HAVING U-SHAPED STRUCTURE, METHOD OF MANUFACTURING SEMICONDUCTOR DEVICE, AND ELECTRONIC DEVICE

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Chen Li, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 696 days.

(21) Appl. No.: 17/919,652

(22) PCT Filed: Mar. 23, 2021

(86) PCT No.: PCT/CN2021/082400
§ 371 (c)(1),
(2) Date: Oct. 18, 2022

(87) PCT Pub. No.: WO2021/213115
PCT Pub. Date: Oct. 28, 2021

(65) Prior Publication Data
US 2023/0163204 A1     May 25, 2023

(30) Foreign Application Priority Data
Apr. 23, 2020    (CN) .......................... 202010329915.2

(51) Int. Cl.
*H01L 29/775*        (2006.01)
*H01L 27/088*        (2006.01)
(Continued)

(52) U.S. Cl.
CPC ......... *H10D 30/43* (2025.01); *H10D 30/6735* (2025.01); *H10D 62/122* (2025.01);
(Continued)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 7,948,307 B2 * 5/2011 Chang ................... H10D 30/62
327/566
2005/0224800 A1 * 10/2005 Lindert ............... H10D 30/791
257/66
(Continued)

FOREIGN PATENT DOCUMENTS

| CN | 105932057 A | 9/2016 |
| CN | 109103254 A | 12/2018 |
| CN | 111477684 A | 7/2020 |

OTHER PUBLICATIONS

International Preliminary Report on Patentability for International Application No. PCT/CN2021/082400, dated Nov. 3, 2022, 12 Pages.
(Continued)

*Primary Examiner* — David C Spalla
(74) *Attorney, Agent, or Firm* — Christopher R. Christenson; Kelly, Holt & Christenson, P.L.L.C.

(57) ABSTRACT

Disclosed are a semiconductor device having a U-shaped structure, a method of manufacturing the semiconductor device, and an electronic including the semiconductor device. According to an embodiment, the semiconductor device may include: a first fin and a second fin disposed opposite to each other, wherein the first fin and the second fin extend in a vertical direction with respect to a substrate;
(Continued)

a connection nanosheet connecting a bottom end of the first fin to a bottom end of a second fin to form a U-shaped structure, wherein the connection nanosheet is spaced apart from a top surface of the substrate.

26 Claims, 20 Drawing Sheets

(51) Int. Cl.

| | |
|---|---|
| *H01L 29/06* | (2006.01) |
| *H01L 29/423* | (2006.01) |
| *H01L 29/66* | (2006.01) |
| *H10D 30/43* | (2025.01) |
| *H10D 30/67* | (2025.01) |
| *H10D 62/10* | (2025.01) |
| *H10D 64/01* | (2025.01) |
| *H10D 84/83* | (2025.01) |

(52) U.S. Cl.
CPC ......... *H10D 64/015* (2025.01); *H10D 64/017* (2025.01); *H10D 84/83* (2025.01)

(58) Field of Classification Search
CPC ........... H10D 30/6212; H10D 30/6213; H10D 30/6735; H10D 62/118; H10D 62/119; H10D 62/121; H10D 62/122; H10D 64/015; H10D 64/017; H10D 64/018; H10D 64/021; H10D 84/0158; H10D 84/0193; H10D 84/83; H10D 84/834; H10D 84/853

See application file for complete search history.

(56) References Cited

U.S. PATENT DOCUMENTS

| | | | | |
|---|---|---|---|---|
| 2014/0239394 | A1* | 8/2014 | Cheng | .............. H01L 21/02494 |
| | | | | 438/157 |
| 2017/0069759 | A1 | 3/2017 | Zang et al. | |
| 2019/0319118 | A1 | 10/2019 | Lee et al. | |
| 2022/0077181 | A1* | 3/2022 | Guo | ...................... H10B 41/27 |

OTHER PUBLICATIONS

International Search Report and Written Opinion for Application No. PCT/2021/082400, Dated Jun. 22, 2021. 9 pages.

* cited by examiner

SEMICONDUCTOR DEVICE HAVING U-SHAPED STRUCTURE, METHOD OF MANUFACTURING SEMICONDUCTOR DEVICE, AND ELECTRONIC DEVICE

CROSS REFERENCE TO RELATED APPLICATION(S)

This application is a Section 371 National Stage Application of International Application No. PCT/CN2021/082400, filed on Mar. 23, 2021, which claims priority to Chinese Patent Application No. 202010329915.2, filed on Apr. 23, 2020 and entitled "Semiconductor device having U-shaped structure, method of manufacturing semiconductor device, and electronic device", the entire content of which is incorporated herein in its entirety by reference.

TECHNICAL FIELD

The present disclosure relates to the field of semiconductors, and more particularly, to a semiconductor device having a U-shaped structure, a method of manufacturing the semiconductor device, and an electronic device including the semiconductor device.

BACKGROUND

Various different structures have been proposed to meet the challenge of further miniaturization of the semiconductor device, such as a fin field effect transistor (FinFET) and a multi-bridge channel field effect transistor (MBCFET). However, further reducing the size of the FinFET and the MBCFET is limited.

SUMMARY

In view of the above, the present disclosure aims to provide, among others, a semiconductor device having a U-shaped structure, a method of manufacturing the semiconductor device, and an electronic device including the semiconductor device.

According to an aspect of the present disclosure, there is provided a semiconductor device, including: a first fin and a second fin disposed opposite to each other, wherein the first fin and the second fin extend in a vertical direction with respect to a substrate; a connection nanosheet connecting a bottom end of the first fin to a bottom end of a second fin to form a U-shaped structure, wherein the connection nanosheet is spaced apart from a top surface of the substrate.

According to another aspect of the present disclosure, there is provided a method of manufacturing a semiconductor device, including: forming, in a substrate, a first trench extending in a first direction, wherein the first trench includes sidewalls disposed opposite to each other and extending in the first direction and a bottom surface connecting the sidewalls; forming, in the first trench, a semiconductor layer extending along the sidewalls and the bottom surface; filling the first trench in which the semiconductor layer is formed, with a first sacrificial layer; forming, on a first side of the first trench filled with the first sacrificial layer in a second direction intersecting the first direction, a second trench entering the substrate and extending in the first direction, wherein the second trench extends to a position below the bottom surface of the first trench in the second direction, and a connection of the semiconductor layer and the first sacrificial layer in the first trench to the substrate is maintained on a second side, which opposite to the first side in the second direction, of the first trench; forming a second sacrificial layer in the second trench; forming, on the second side of the first trench filled with the first sacrificial layer, a third trench entering the substrate and extending in the first direction, wherein the third trench extends to a position below the bottom surface of the first trench in the second direction to reach the second sacrificial layer; and filling the third trench with a third sacrificial layer, so that the semiconductor layer is surrounded by the first sacrificial layer, the second sacrificial layer and the third sacrificial layer, wherein the first sacrificial layer, the second sacrificial layer and the third sacrificial layer are configured to be selectively etched with respect to the semiconductor layer.

According to yet another aspect of the present disclosure, there is provided an electronic device including the semiconductor device described above.

According to embodiments of the present disclosure, the semiconductor device may have two fins, and thus form a dual-fin field effect transistor (DFFET). In addition, the two fins may be connected to each other by a connection nanosheet, thereby forming a U-shaped structure. This may provide high performance and high integration.

BRIEF DESCRIPTION OF THE DRAWINGS

The above and other objects, features, and advantages of the present disclosure will become more apparent from following descriptions on embodiments thereof with reference to attached drawings, in which:

FIGS. 1 to 29(b) are schematic views showing some stages in a process of manufacturing a semiconductor device according to an embodiment of the present disclosure, wherein FIGS. 1 to 18, 28(a) and 29(a) are cross-sectional views taken along line AA';

FIGS. 19, 20(b), 28(d) and 29(b) are top views, in which the top view of FIG. 19 shows positions of line AA', line BB' and line CC';

FIGS. 20(a), 21, 22(a), 23, 24(a), 25(a), 26(a), 27(a) and 28(b) are cross-sectional views taken along line BB';

FIGS. 22(b), 24(b), 25(b), 26(b), 27(b) and 28(c) are cross-sectional views taken along line CC'.

Throughout the drawings, the same or similar reference numbers denote the same or similar elements.

DETAILED DESCRIPTION OF EMBODIMENTS

Figure 1:
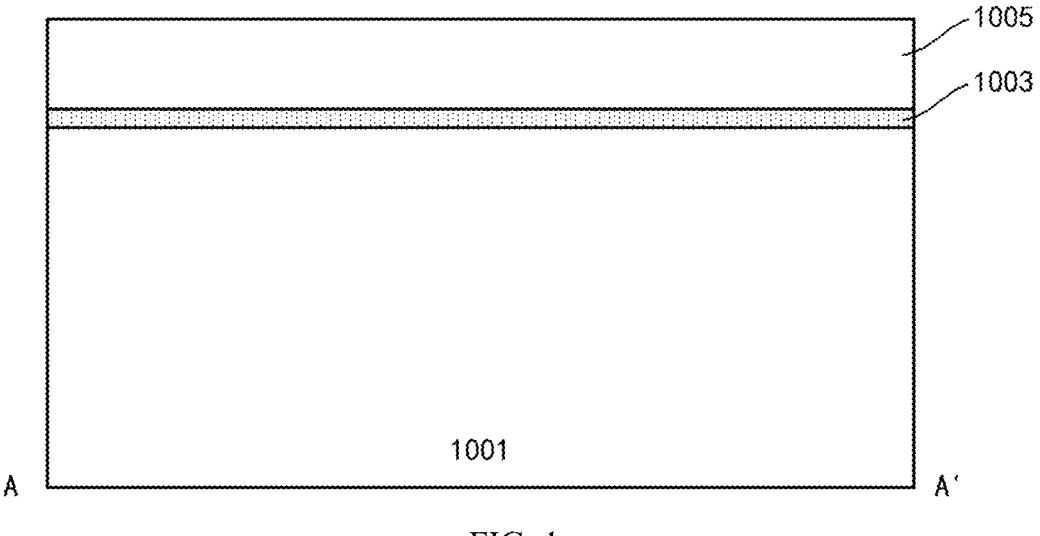

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art may also devise regions/layers of other different shapes, sizes, and relative positions as desired in practice.

In the context of the present disclosure, when a layer/element is recited as being "on" a further layer/element, the layer/element may be disposed directly on the further layer/ element, or otherwise there may be an intervening layer/element interposed therebetween. Further, if a layer/element is "on" a further layer/element in an orientation, then the layer/element may be "under" the further layer/element when the orientation is turned.

According to an embodiment of the present disclosure, a semiconductor device is proposed. The semiconductor device may have a U-shaped structure. The U-shaped structure may include two fins extending in a vertical direction with respect to a substrate (e.g. a direction substantially perpendicular to the substrate) and a connection nanosheet connecting bottom ends of the two fins to each other. The connection nanosheet may be spaced apart from the substrate. Thus, when such U-shaped structure is used as a channel portion, a surrounding gate may be formed.

As described below, such U-shaped structures may be fabricated using a trench in the substrate as a template. For example, such U-shaped structure may be formed by epitaxially growing a semiconductor layer on a sidewall of the trench and a bottom surface of the trench. Thus, the U-shaped structure may be integral and may have a substantially uniform thickness. The bottom surface of the trench may be substantially parallel to a top surface of the substrate, and thus the connection nanosheet formed on the bottom surface of the trench may be substantially parallel to the top surface of the substrate. The semiconductor layer formed in the same trench may be separated into several parts in a longitudinal extension direction of the trench ("a first direction") and the parts are used for respective semiconductor devices. Thus, semiconductor devices adjacent in the first direction have their respective U-shaped structures being aligned with each other. For example, the vertical fin of one of the semiconductor devices adjacent in the first direction is substantially coplanar with the vertical fin of the other of the semiconductor devices adjacent in the first direction and the connection nanosheet of the one of the semiconductor devices adjacent in the first direction is substantially coplanar with the connection nanosheet of the other of the semiconductor devices adjacent in the first direction.

Such U-shaped structure may be used as the channel portion, so that the semiconductor device may be a double-fin field effect transistor (DFFET). In this case, the semiconductor device may further include source/drain portions on opposite sides of the U-shaped structure in the first direction. The U-shaped structure is connected between the source/drain portions on opposite sides of the U-shaped structure, wherein a conductive channel between the source/drain portions may be formed. The source/drain portions may include a material identical to the material of the channel portion, or may include a material different from a material of the channel portion to, for example, apply stress to the channel portion to enhance device performance The U-shaped structure may include a single crystal semiconductor material to improve the device performance. Of course, the source/drain portion may also include the single crystal semiconductor material.

The semiconductor device may further include a gate stack intersecting the channel portion. The gate stack may extend in a second direction intersecting (e.g. perpendicular to) the first direction. As described above, since the U-shaped structure is spaced from the substrate, the gate stack may surround the U-shaped structure and define a channel region therein.

Gate spacers may be formed on sidewalls on opposite sides of the gate stack in the first direction. The gate stack may be separated from the source/drain portions by the gate spacers. Outer sidewalls of the gate spacer facing each source/drain portion may be substantially coplanar in the vertical direction, and may be substantially coplanar with a sidewall of the U-shaped structure. Inner sidewalls of the gate spacer facing the gate stack may be substantially coplanar in the vertical direction, so that the gate stack may have a substantially uniform gate length. The gate spacer may have a substantially uniform thickness.

Such semiconductor device may be manufactured, for example, as follows.

A first trench extending in the first direction may be formed in the substrate to serve as the template for forming the semiconductor layer as described above. More specifically, the first trench may include sidewalls disposed opposite to each other and extending in the first direction and a bottom surface connecting the sidewalls. The semiconductor layer may be formed on the sidewalls of the first trench and the bottom surface of the first trench. Accordingly, the semiconductor layer may include a portion (vertical fins) extending along the sidewalls of the first trench and a portion (the connection nanosheet) extending along the bottom surface of the first trench. The first trench may be filled with a first sacrificial layer to cover the semiconductor layer, so as to substantially define a sacrificial gate above the semiconductor layer.

A second trench extending in the first direction may be formed on a side of the first trench in which the semiconductor layer is formed and the first sacrificial layer is filled, in the second direction intersecting (e.g. perpendicular to) the first direction. The second trench may extend to a position below the bottom surface of the first trench in the second direction. The second trench may be filled with a second sacrificial layer such that a sacrificial gate may be defined on this side of the semiconductor layer and below the bottom surface of the semiconductor layer. When forming the second trench, the semiconductor layer formed in the first trench and the first sacrificial layer filled in the first trench may remain being connected to the substrate on another side in the second direction, so as to prevent the semiconductor layer from collapsing.

Similarly, a third trench extending along the first direction may be formed on another side of the first trench in which the semiconductor layer is formed and the first sacrificial layer is formed, in the second direction. The third trench may extend to the position below the bottom surface of the first trench in the second direction to reach the second sacrificial layer. The third trench may be filled with a third sacrificial layer so that a sacrificial gate may be defined under another side of the semiconductor layer and the bottom surface of the semiconductor layer. Since the third trench extends to the second sacrificial layer, the third sacrificial layer filled in the third trench may be connected to the second sacrificial layer. In addition, the second trench and the third trench may be formed along the sidewalls of the first trench, so the second sacrificial layer in the second trench and the third sacrificial layer in the third trench may be connected to the first sacrificial layer in the first trench. Accordingly, the first sacrificial layer, the second sacrificial layer, and the third sacrificial layer may be connected to each other to surround the semiconductor layer, and thus may become the sacrificial gate. The sacrificial gate may have etching selectivity with respect to the semiconductor layer, so as to be subsequently replaced with the gate stack.

In order to electrically isolate the gate stack from the substrate, an isolation layer may be disposed between the sacrificial gate and the substrate. For example, before filling the second trench and the third trench with the second sacrificial layer and the third sacrificial layer respectively, isolation layers with a certain thickness may be formed in the second trench and the third trench. The isolation layer formed in the second trench and the isolation layer formed in the second trench may be connected to each other so as to be interposed between the sacrificial gate and the substrate.

The sacrificial gate may be patterned as a stripe extending in the second direction. The semiconductor layer may be patterned by using the sacrificial gate as a mask, so as to be left below the sacrificial gate to serve as the channel portion. On opposite sides of the semiconductor layer in the first direction on the substrate, the source/drain portions in contact with the semiconductor layer may be formed by, for example, epitaxial growth. The sacrificial gate may be replaced by a real gate stack through a gate replacement process.

The present disclosure may be presented in various forms, and some examples of which will be described below. In the following description, the selection of various materials is involved. For the selection of materials, etching selectivity is also considered in addition to considering their functions (for example, semiconductor materials are configured to form active areas and dielectric materials are configured to form electrical isolation). In the following description, the required etching selectivity may or may not be indicated. It should be clear to those skilled in the art that when etching a certain material layer is mentioned below, if it is not mentioned that other layers are also etched or the drawing does not show that other layers are also etched, then this etching may be selective, and the material layer may have etching selectivity with respect to other layers exposed to the same etching recipe.

FIGS. 1 to 29(b) are schematic views showing some stages in a flow of manufacturing a semiconductor device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate will be described by way of example for the convenience of description.

As described above, a trench may be formed in the substrate 1001 to serve as the template for forming the U-shaped structure. To form the trench, a hard mask layer may be formed on the substrate 1001 and an opening may be defined in the hard mask layer. The trench may be defined in the substrate 1001 using the opening in the hard mask layer. In addition, during manufacturing the semiconductor device based on the U-shaped structure (e.g. used as the channel portion), it is desired to form a processing channel on each of the opposite sides of the U-shaped structure (when a side is processed through the corresponding processing channel, another side remains being connected to the substrate, so as to avoid collapse of the U-shaped structure). In order to reduce the number of masking steps and achieve a self-aligned mask, according to an embodiment of the present disclosure, portions of the hard mask layer located on opposite sides of the opening may be respectively formed by using different materials having etching selectivity with respect to each other.

According to an embodiment of the present disclosure, the hard mask layer that meets the above conditions may be provided in combination with a spacer formation process. For example, a spacer may be formed on a sidewall of a mandrel pattern. Accordingly, the mandrel pattern (as a part of the hard mask layer) is located on one side of the spacer, while a material that has etching selectivity with respect to the mandrel pattern (as another part of the hard mask layer) is formed on the other side of the spacer. In this way, the mandrel pattern and the material may constitute the hard mask layer. The opening may be defined in such hard mask layer by removing the spacer. Portions of the hard mask layer on both sides of the opening may have etching selectivity with respective to each other. Furthermore, a width of the opening and a width of the trench may be better controlled by using the spacer to define the opening.

Figure 2:
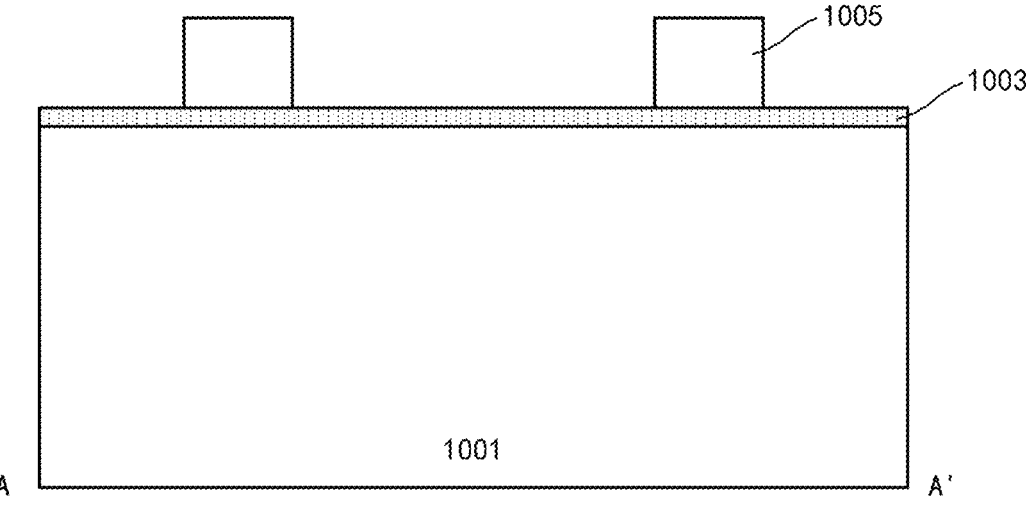

For example, an etching stop layer 1003 and a mandrel layer 1005 may be sequentially formed on the substrate by, for example, deposition. The etching stop layer 1003 may have etching selectivity with respective to the substrate 1001 and the mandrel layer 1005. For example, the etching stop layer 1003 may include oxide (e.g. silicon oxide), and the thickness thereof is, about 2 nm to 10 nm. The mandrel layer 1005 may include polysilicon to achieve good etching quality, and the thickness thereof is, for example, about 50 nm to 150 nm. Then, as shown in FIG. 2, selective etching, such as reactive ion etching (RIE), may be performed on the mandrel layer 1005 by using a photoresist (not shown), to form the mandrel pattern (still labeled as 1005). Here, RIE may be along the vertical direction (e.g. a direction substantially perpendicular to a surface of the substrate 1001), so that the mandrel pattern 1005 may have a vertical sidewall. The mandrel pattern 1005 may have a shape of strip extending in a first direction (a direction entering the paper in the figure), such that the sidewall of the mandrel pattern 1005 may extend in the first direction. RIE may be stopped at the etching stop layer 1003. Afterwards, the photoresist may be removed.

Figure 3:
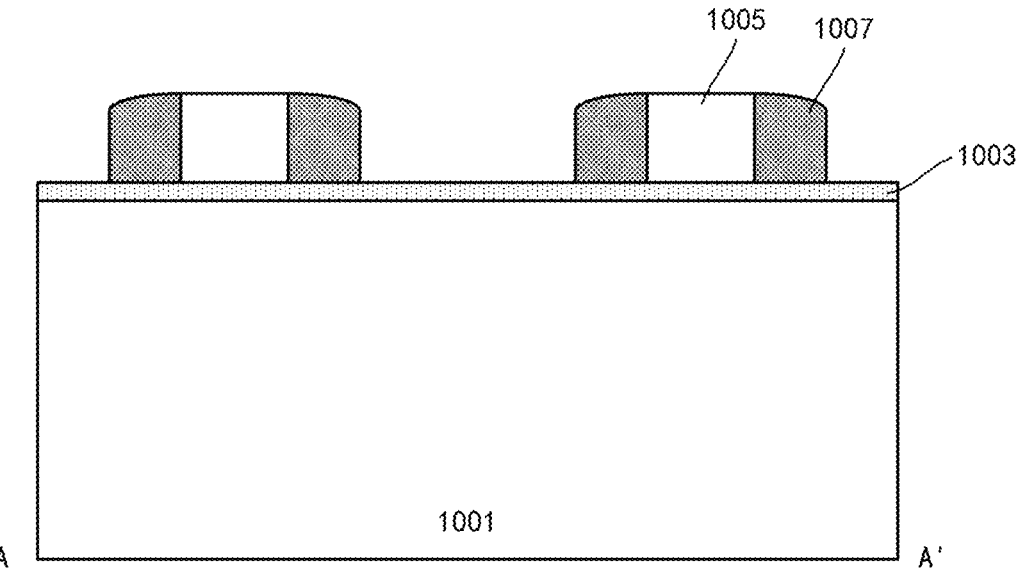

As shown in FIG. 3, a spacer 1007 may be formed on the sidewall of the mandrel pattern 1005. The formation of the spacer may include substantially conformally forming, e.g. depositing a spacer material layer, and performing anisotropic etching, such as RIE in the vertical direction (may stop at the etching stop layer 1003), on the formed spacer material layer. A thickness of the spacer 1007 (a dimension in a horizontal direction in the figure) or a thickness of the deposited spacer material layer may be determined according to a width of a trench to be formed (the dimension in the horizontal direction in the figure). As an example, the thickness of the deposited spacer material layer may be about 10 nm to 25 nm. The spacer 1007 may include a material having etching selectivity with respect to the mandrel pattern 1005 (and the etching stop layer 1003), such as SiC.

Figure 4:
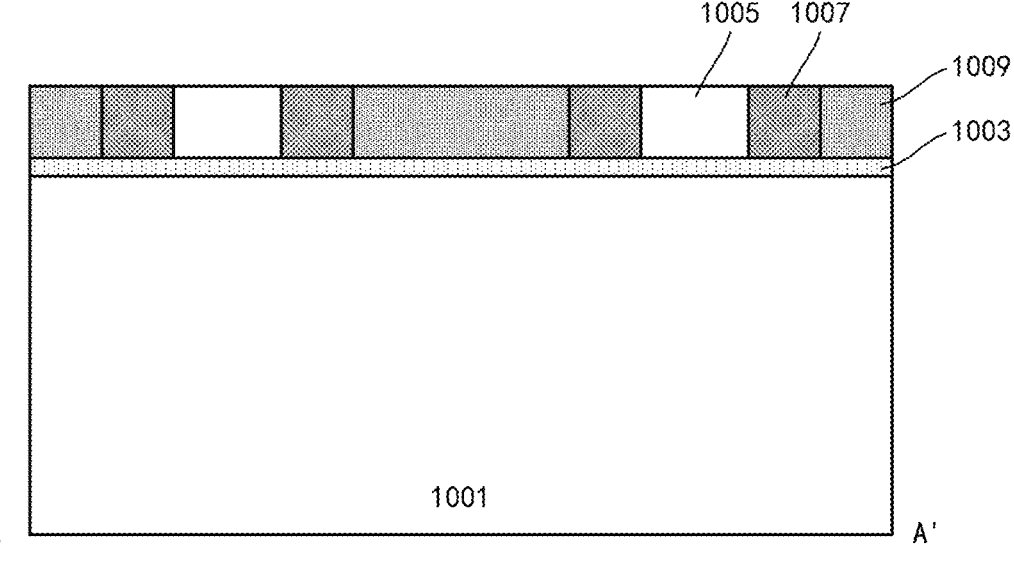

As shown in FIG. 4, a first sub-hard mask layer 1009 may be formed on the substrate 1001. The first sub-hard mask layer 1009 along with the mandrel pattern 1005 (subsequently replaced by a second sub-hard mask layer 1011, see FIG. 5) may define the hard mask layer. As described above, the first sub-hard mask layer 1009 may include a material having etching selectivity with respect to the spacer 1009 and the mandrel pattern 1005 (or the second sub-hard mask layer 1011, which subsequently replaces the mandrel pattern 1005), such as nitride (e.g. silicon nitride). For example, a nitride layer 1009 may be formed by depositing silicon nitride of about 50 nm to 150 nm, and subjecting the deposited silicon nitride to a planarization treatment such as chemical mechanical polishing (CMP) until the spacer 1007 and the mandrel pattern 1005 are exposed.

Figure 5:
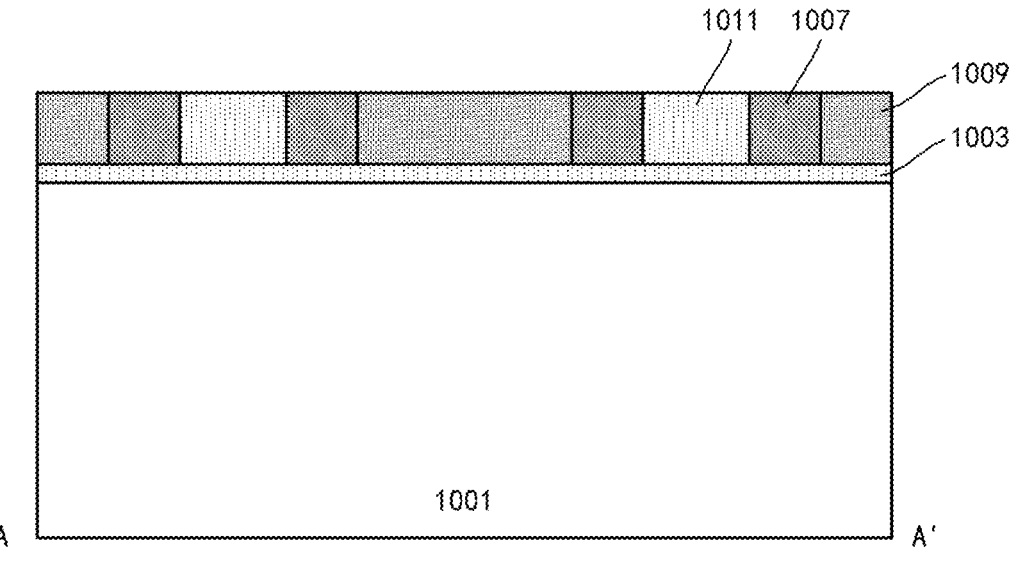

To avoid the damage to the hard mask layer due to the mandrel pattern 1005 (polysilicon in this example) being etched in the process of forming the trench by etching the substrate 1001 (Si in this example), the mandrel pattern 1005 may be replaced by another material. As shown in FIG. 5, the mandrel pattern 1005 of polysilicon may be replaced by, e.g. the second sub-hard mask layer 1011 of oxide by etching, deposition and planarization. The second sub-hard mask layer 1011 defines the hard mask layer together with the first sub-hard mask layer 1009.

The replacement for the mandrel pattern 1005 may be omitted in some cases, such as in a case that oxide is used as the mandrel pattern 1005 (using as the mandrel pattern 1005 is for better etching quality).

As shown in FIG. 5, the first sub-hard mask layer 1009 and the second sub-hard mask layer 1011 together constitute the hard mask layer, and the spacer 1007 is embedded therein. The hard mask layer in this form may reduce the number of masking steps and achieve a self-aligned mask to save area, which will be described in further detail below.

Figure 6:
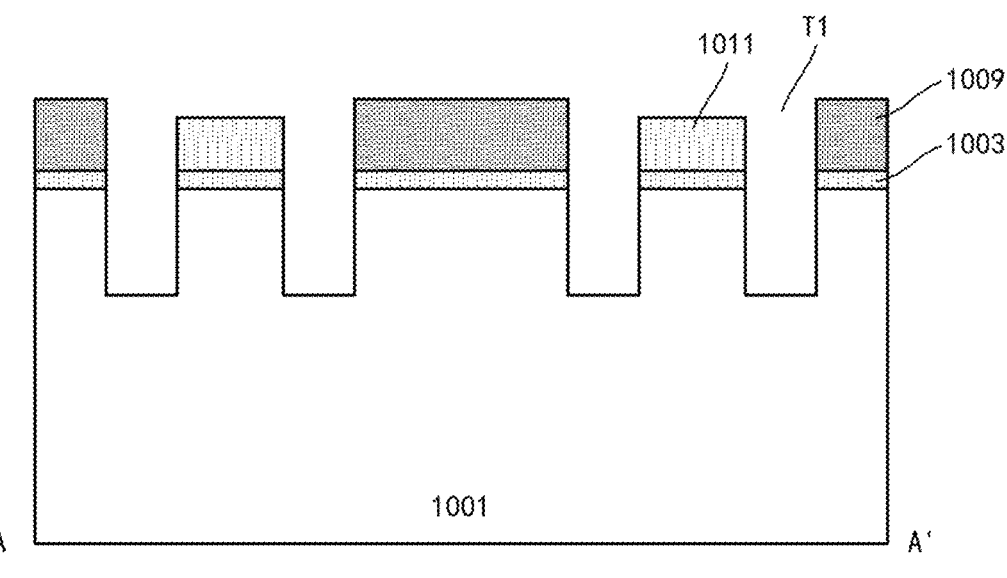

As shown in FIG. 6, the spacer 1007 may be removed by selective etching, so that openings are formed in the hard mask layer 1009+1011. The widths of such openings (the dimension in the horizontal direction in the figure) are defined by a width of the spacer 1007. By using the hard mask layer 1009+1011 having the openings as an etching mask, selective etching such as RIE along the vertical direction is performed on the etching stop layer 1003 and the substrate 1001 to form a trench T1 in the substrate 1001. Here, when the etching stop layer 1003 is etched, a height of the second sub-hard mask layer 1011 (in this example, the second sub-hard mask layer 1011 and the etching stop layer 1003 are both oxides) may be reduced. A width of the trench T1 (the dimension in the horizontal direction in the figure) may be defined by the openings in the hard mask layer or the width of the spacer 1007.

Figure 7:
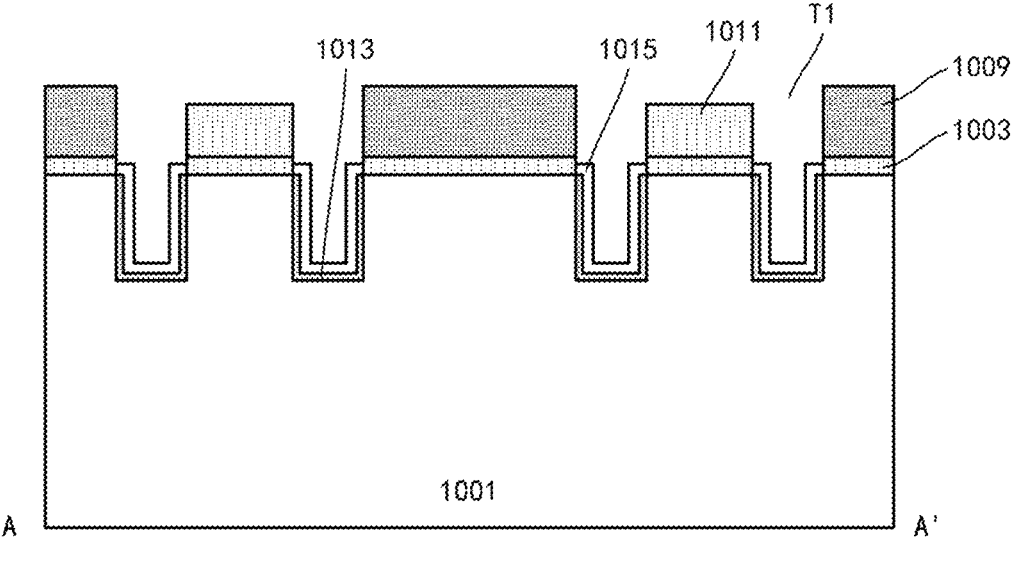

Sidewalls of the trench T1 and a bottom surface of the trench T1 provide a template for forming the U-shaped structure. For example, as shown in FIG. 7, a semiconductor layer 1015 may be formed on the sidewalls of the trench T1 and the bottom surface of the trench T1, e.g. by epitaxial growth, to obtain a U-shaped nanosheet. Here, the silicon process is taken as an example for description, that is, the semiconductor layer 1015 includes Si. In order to provide etching selectivity in the following (especially when etching the substrate 1001), an etching stop layer 1013 may be formed, e.g. by epitaxial growth, on the sidewalls of the trench T1 and the bottom surface of the trench T1 before forming the semiconductor layer 1015. The semiconductor layer 1015 may be grown on a surface of the etching stop layer 1013. The etching stop layer 1013 may include a material having etching selectivity with respect to the semiconductor layer 1015 and the substrate 1001, such as SiGe (e.g. an atomic percentage of Ge is about 20% to 50%), and the thickness thereof is, for example, about 1 nm to 3 nm. In a case where the semiconductor layer 1015 has etching selectivity with respect to the substrate 1001, the etching stop layer 1013 may be omitted.

Figure 8:
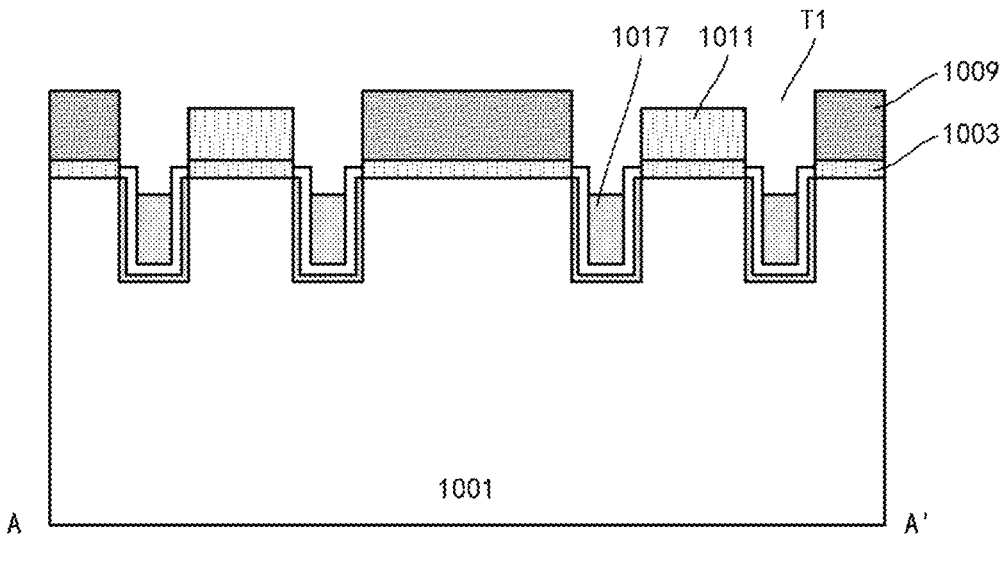
Figure 9:
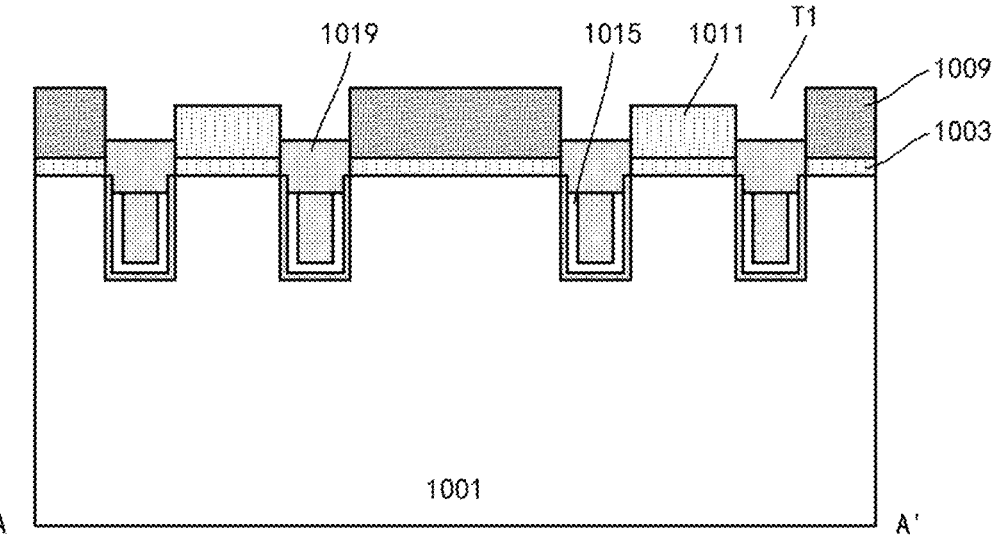

Currently, a top end of the semiconductor layer 1015 may have a small bent portion. Such bent portion at the top end of the semiconductor layer 1015 may be removed to enhance device stability. For example, as shown in FIG. 8, the trench T may be filled with a first sacrificial layer 1017 to shield a lower portion of the semiconductor layer 1015 and expose a top portion thereof, wherein the trench T is formed with the etching stop layer 1013 and the semiconductor layer 1015. Such filling may be achieved by deposition, planarization such as CMP and then etching back. Considering that the etching stop layer 1013 needs to be removed together when performing the gate replacement process, the first sacrificial layer 1017 may include similar or the same material as the etching stop layer 1013, so as to have similar or the same etch selectivity as the etching stop layer 1013 for the same etching recipe subsequently. For example, the first sacrificial layer 1017 may include SiGe, wherein the atomic percentage of Ge is about 20% to 50%, being substantially the same as or close to that of the etching stop layer 1013. Then, as shown in FIG. 9, the portion of the semiconductor layer 1015 exposed by the first sacrificial layer 1017 may be removed by selective etching such as RIE. Thus, the semiconductor layer 1015 has a U shape. In a case where a top surface of the first sacrificial layer 1017 is substantially flat, top ends of the U-shaped semiconductor layer 1015 may be at substantially the same height.

Such U-shaped semiconductor layer 1015 may be used as the channel portion of the semiconductor device. In this case, two vertically extending portions of the U-shaped semiconductor layer 1015 (portions extending on the side-walls of the trench T1) may be used as active fins of the device. The obtained semiconductor device may be referred to as the double-fin field effect transistor (DFFET). In addition, the two active fins may be connected to each other through a laterally extending portion of the U-shaped semi-conductor layer 1015 (a portion extending on the bottom surface of the trench T1). The laterally extending portion may also be referred to as the connection nanosheet, which may also be used as the channel portion of the semiconductor device.

In order to fully utilize the various portions of the U-shaped semiconductor layer 1015, a gate stack surrounding the U-shaped semiconductor layer 1015 may be formed. The gate stack may be formed by the gate replacement process. In the gate replacement process, a sacrificial gate surrounding the U-shaped semiconductor layer 1015 may be formed. That is, the sacrificial gate may be formed on the left side, right side, upper side and lower side the U-shaped semiconductor layer 1015.

For example, as shown in FIG. 9, the trench T1 may be filled with a sacrificial layer 1019. Again, such filling may be achieved by deposition, planarization such as CMP and then etching back. The sacrificial layer 1019 may include similar or the same material as the first sacrificial layer 1017 so as to have similar or the same etching selectivity for the same etching recipe subsequently. For example, the sacrificial layer 1019 may include SiGe, wherein the atomic percentage of Ge is about 20% to 50%, being substantially the same as or close to that in the first sacrificial layer 1017. The sacrificial layer 1019 along with the first sacrificial layer 1017 in the trench T1 may roughly define a sacrificial gate above the U-shaped semiconductor layer 1015. The sacrificial layer 1019 in the trench T1 and the first sacrificial layer 1017 may be processed together (e.g. removed together) in a subsequent process, so that they are shown as a whole and collectively referred to as the first sacrificial layer in the following figures.

In order to form sacrificial gates on the left side, right side and lower side of the U-shaped semiconductor layer 1015, processing channels entering the left side, right side and lower side of the U-shaped semiconductor layer 1015 are required. As described above, such processing channels may be defined respectively by the first sub-hard mask layer 1009 and the second sub-hard mask layer 1011. In addition, for the convenience of the gate replacement process, the sacrificial gates formed on the left side, right side, upper side and lower side of the U-shaped semiconductor layer 1015 (the above sacrificial gate include the above-mentioned first sacrificial layer) may include the same or similar material, and may be removed by using the same etching recipe. In order to avoid the influence on the first sacrificial layer during the process of forming the sacrificial gates on the left side, right side and lower side of the U-shaped semiconductor layer 1015, a protective plug may be formed on the top of the first sacrificial layer in the trench T1.

Figure 10:
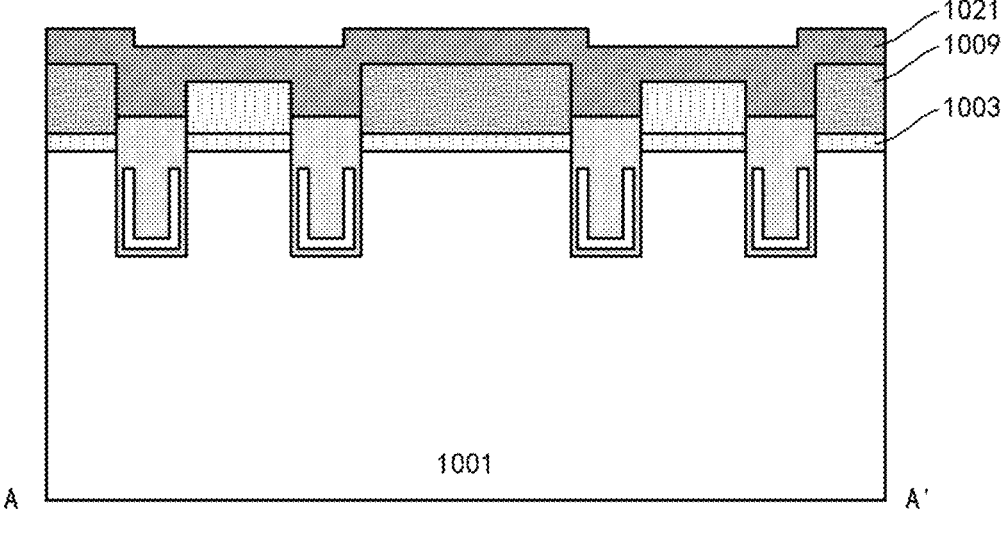
Figure 11:
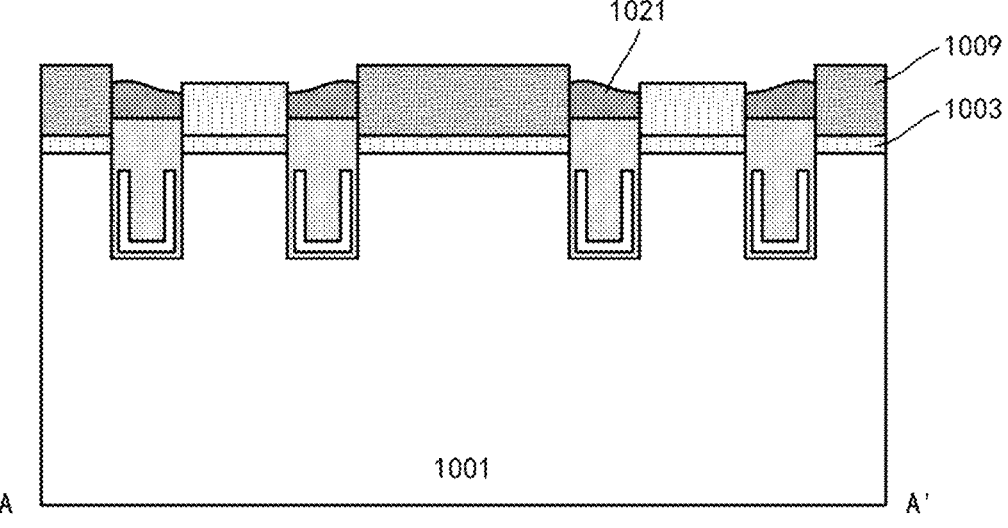

For example, as shown in FIG. 10, a protective material layer 1021 may be formed on the substrate, e.g. by deposition. The protective material layer 1021 may include a material having etching selectivity with respect to the hard mask layer 1009+1011 (and the first sacrificial layer), such as SiC. Here, it is shown that the protective material layer 1021 is formed to fill the trench T1, but there are undulations on a top surface of the protective material layer 1021 due to the contours of each layer below the protective material layer 1021. However, the present disclosure is not limited thereto. For example, the protective material layer 1021 may be formed thick enough so that the top surface thereof is substantially flat. Then, as shown in FIG. 11, the protective material layer 1021 may be etched back to remove portions of the protective material layer 1021 located on the top surfaces of the first sub-hard mask layer 1009 and the second sub-hard mask layer 1011. However, a portion of the protective material layer 1021 located in the trench T1 may be remained to form the protective plug (still labeled as 1021). Likewise, there may be undulations on the top surface of the protective plug 1021, but the present disclosure is not limited thereto.

Next, the processing channels are respectively formed on opposite sides of the U-shaped semiconductor layer 1015 (or, in other words, the trench T1) in the second direction (the horizontal direction on the paper in the figure) intersecting (e.g. perpendicular to) the first direction.

Figure 12:
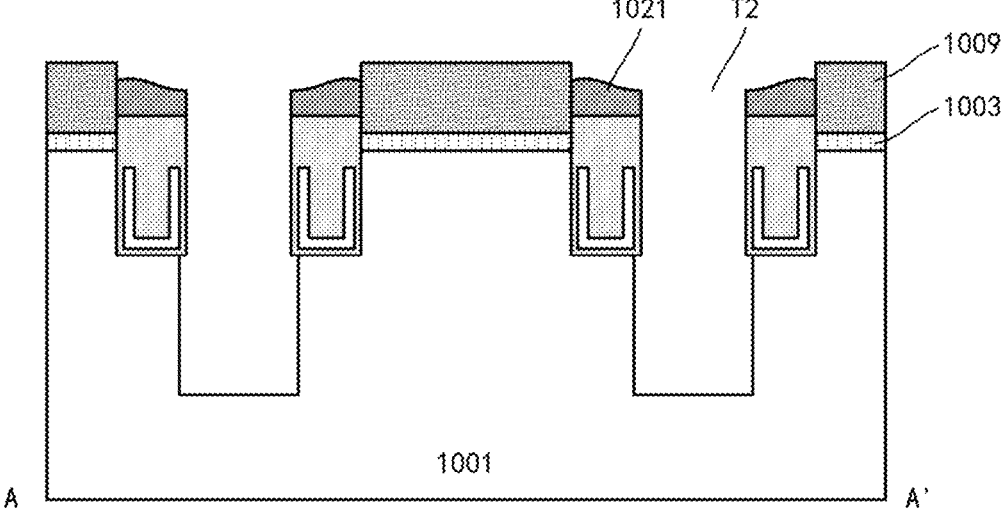

For example, as shown in FIG. 12, the second sub-hard mask layer 1011 and the etching stop layer 1003 below the second sub-hard mask layer 1011 may be removed by selective etching such as RIE, and thus the exposed substrate 1001 may be selectively etched to form a trench T2 by, e.g. RIE. Accordingly, for each U-shaped semiconductor layer 1015, one side of the U-shaped semiconductor layer 1015 is exposed in the trench T2, while the other side of the U-shaped semiconductor layer 1015 is still connected to the substrate 1001, thereby maintaining mechanical stability.

If a hard mask layer of a single material is used, the photoresist may be formed on the hard mask layer. The photoresist is patterned to shield a position on the hard mask layer where the first sub-hard mask layer 1009 is located in this embodiment, and expose a position on the hard mask layer where the second sub-hard mask layer 1011 is located in this embodiment. The hard mask layer is selectively etched by using the patterned photoresist as the mask, in order to expose the underlying substrate. As can be seen, a masking step is added.

Figure 13:
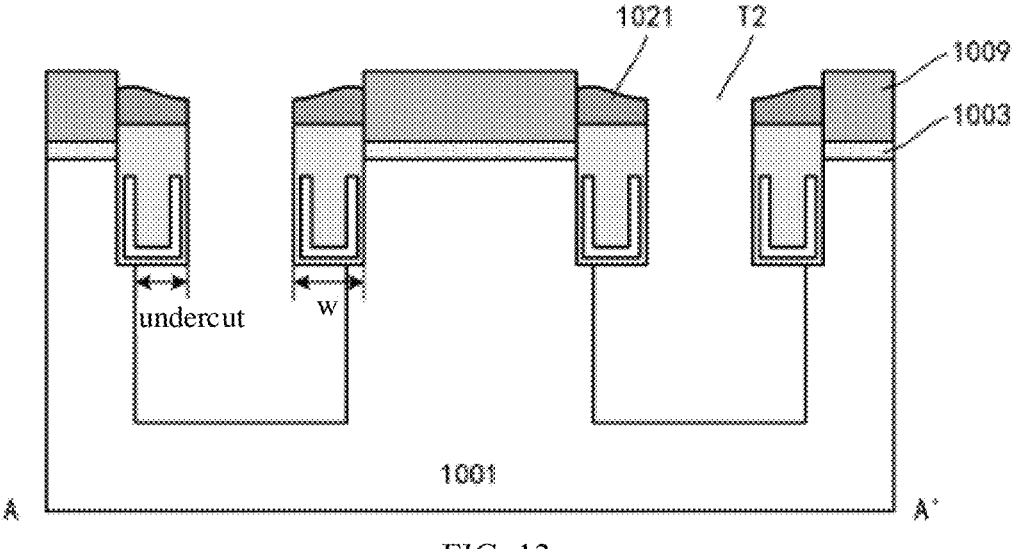

In addition, as shown in FIG. 13, the substrate 1001 may be further selectively etched. The used etching recipe may have lateral etching characteristics. For example, by using isotropic etching such as wet etching with a TMAH solution, the trench T2 is extended to a position below the U-shaped semiconductor layer 1015 (or in other words, the trench T1) in the second direction to form an undercut. Here, a degree of the undercut (or in other words, the lateral expansion of the trench T2 from one sidewall of the trench T1 to the other sidewall of the trench T1) may be smaller than a width w of the trench T1 (so that the bottom surface of the trench T1 having the etching stop layer 1013, the semiconductor layer 1015 and the first sacrificial layer being formed therein will not be completely suspended, so as to maintain mechanical stability), and may be greater than w/2 (so that when the trench is formed on the another side, the semiconductor layer 1015 may be fully supported). The sacrificial gate may be formed on a side of each trench T1 and below the trench T1 through such trench T2.

Figure 14:
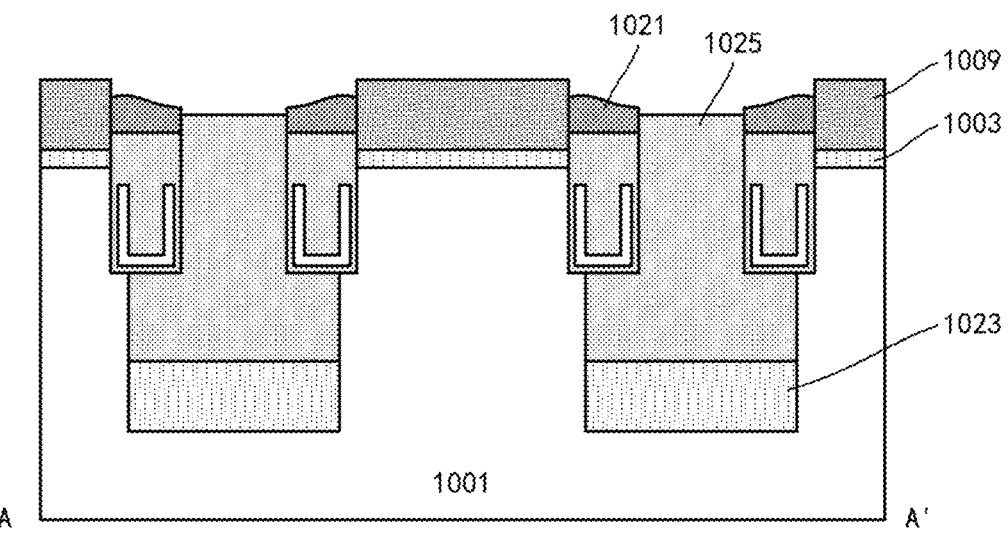

Considering the electrical isolation between the gate stack and the substrate, as shown in FIG. 14, an isolation layer 1023 may be formed at the bottom of the trench T2 before forming the sacrificial gate. The isolation layer 1023 may include a suitable dielectric material, such as oxide. The isolation layer 1023 may be formed by deposition, planarization such as CMP and then etching back. Here, the etching recipe used in the etch-back may have lateral etching characteristics such as isotropic etching, so that a top surface of the isolation layer 1023 may have a certain distance from the bottom surface of the trench T1 below the trench T1, and thus the bottom surface of the trench T1 is not covered by the isolation layer 1023 (but is covered by a second sacrificial layer formed later). Then, the trench T2 having the isolation layer 1023 formed at the bottom may be further filled with a second sacrificial layer 1025. Again, such filling may be done by deposition, planarization such as CMP and then etching back. The second sacrificial layer 1025 may roughly define the sacrificial gate on a side of the U-shaped semiconductor layer 1015 and below a part of the bottom surface of the U-shaped semiconductor layer 1015. Accordingly, the second sacrificial layer 1025 may include similar or the same material as the first sacrificial layer so as to have similar or same etching selectivity for the same etching recipe subsequently. For example, the second sacrificial layer 1025 may include SiGe, wherein the atomic percentage of Ge is about 20% to 50%, being substantially the same as or close to that in the first sacrificial layer.

In subsequent processes, the etching stop layer 1013, the first sacrificial layer and the second sacrificial layer 1025 having similar or same material may be processed together, which are shown as integral in subsequent figures and are collectively labeled as 1025'.

Figure 15:
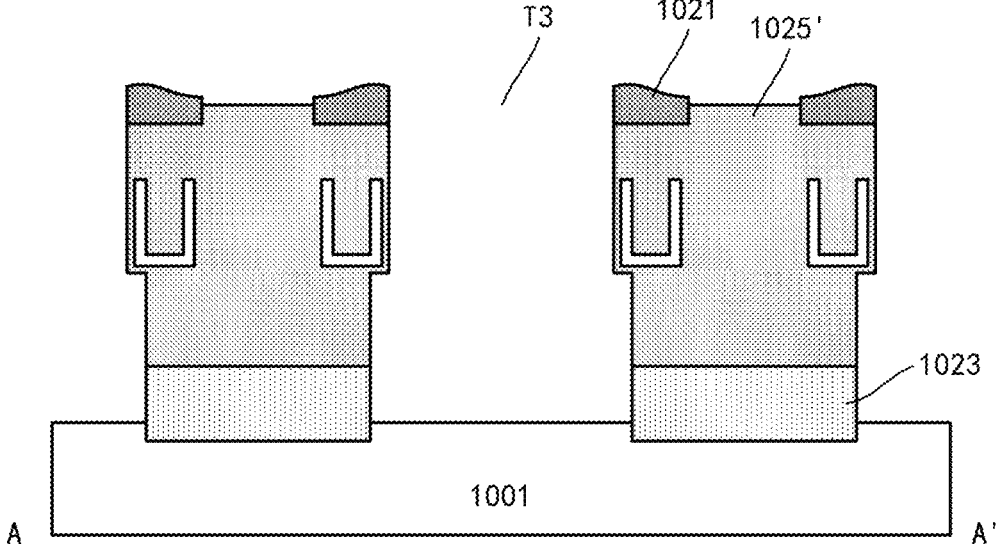

Similar processing may be performed on the other side of each U-shaped semiconductor layer 1015 in the second direction. For example, as shown in FIG. 15, the first sub-hard mask layer 1009 and the etching stop layer 1003 below the first sub-hard mask layer 1009 may be removed by selective etching such as RIE, and thus the exposed substrate 1001 may be selectively etched to form a trench T3 by e.g. RIE. During the etching process, the sidewalls of the first sacrificial layer in the trench T1, the sidewalls of the second sacrificial layer in the trench T2 (collectively labeled as 1025' in FIG. 15) and sidewalls of the isolation layer 1023 may be exposed. Since the undercut is larger than w/2 as described above, most of the bottom surface of the structure in the trench T1 may be supported, thereby enhancing the mechanical stability.

If a hard mask layer of a single material is used, the photoresist may be formed on the hard mask layer. The photoresist is patterned to shield a position on the hard mask layer where the second sub-hard mask layer 1011 is located in this embodiment, and expose a position on the hard mask layer where the first sub-hard mask layer 1009 is located in this embodiment. The hard mask layer is selectively etched to expose the underlying substrate by using the patterned photoresist as the mask. As can be seen, the masking step is added.

Figure 16:
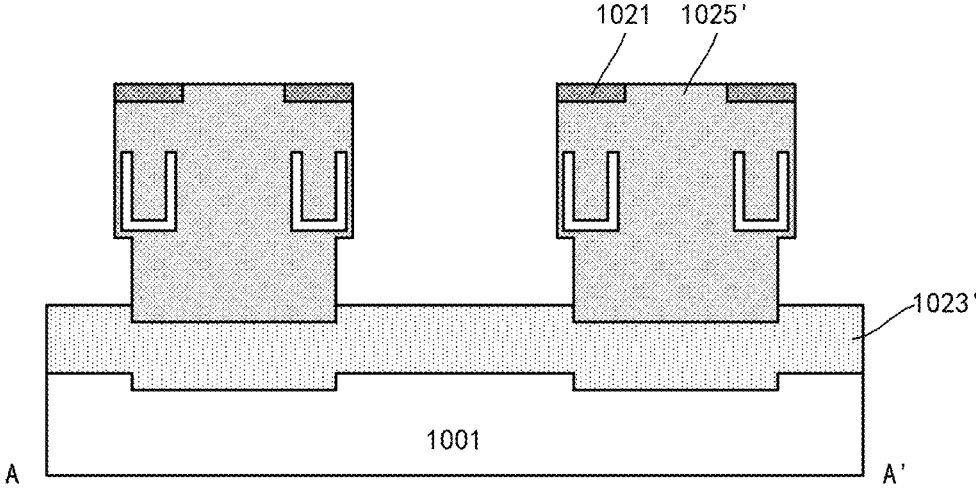

Similarly, as shown in FIG. 16, an isolation layer such as oxide may be formed at the bottom of the trench T3. The formation of the isolation layer may refer to the previous description in conjunction with FIG. 14. The isolation layer formed here and the previously formed isolation layer 1023 may be connected to each other, which are shown as integral and are collectively labeled as 1023'. Top surfaces of exposed portions of the isolation layer 1023' may be substantially at the same height, but the present disclosure is not limited thereto. In addition, during the planarization process to form the isolation layer, the protection plug 1021 may become substantially coplanar with the sacrificial layer 1025'.

Figure 17:
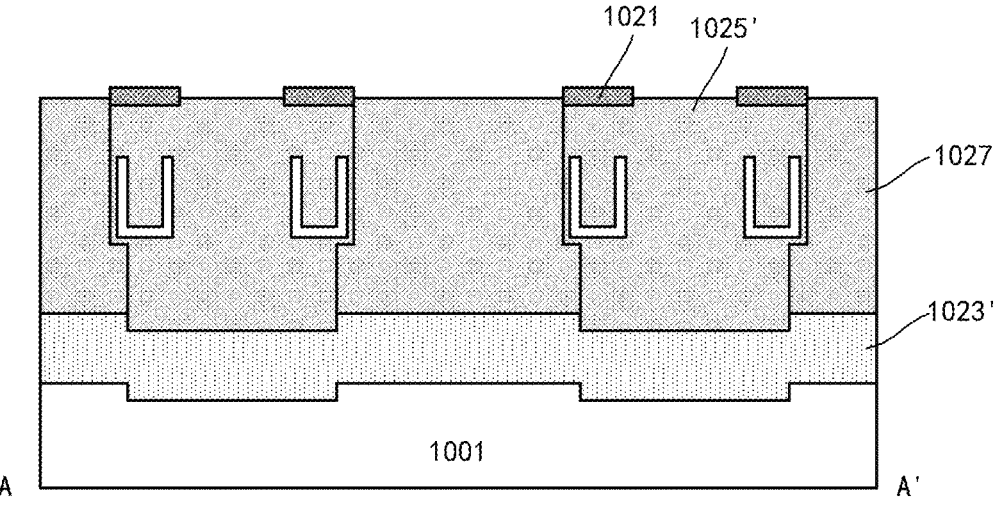

Then, as shown in FIG. 17, the trench T3 having the isolation layer 1023' formed at the bottom may be further filled with a third sacrificial layer 1027. Again, such filling may be achieved by deposition, planarization such as CMP and then etching back. The third sacrificial layer 1027 may roughly define the sacrificial gate on the other side of the U-shaped semiconductor layer 1015 and the sacrificial gate below the bottom surface of the reset of the U-shaped semiconductor layer 1015. Accordingly, the third sacrificial layer 1027 may include a similar or the same material as the first sacrificial layer and the second sacrificial layer, so as to have similar or same etching selectivity for the same etching recipe subsequently. For example, the third sacrificial layer 1027 may include SiGe, wherein the atomic percentage of Ge is about 20% to 50%, being substantially the same as or close to that of the first sacrificial layer and the second sacrificial layer. In addition, during the etch-back process of forming the third sacrificial layer 1027, the sacrificial layer 1025' may further be etched back to a certain extent. The top surface of the sacrificial layer 1025' may be substantially coplanar with a top surface of the third sacrificial layer 1027.

It can be seen that the third sacrificial layer 1027 and the previously formed sacrificial layer 1025' surround the U-shaped semiconductor layer to form the sacrificial gate. The sacrificial gate is electrically isolated from the substrate 1001 by the isolation layer 1023'. Afterwards, the third sacrificial layer 1027 and the previously formed sacrificial layer 1025' are shown as integral and are collectively labeled as 1027'.

The protective plug 1021 may be removed by selective etching such as RIE. The planarization process such as CMP may be performed on the exposed sacrificial gate 1027' to make its top surface flat. Before the planarization process, a material having similar or the same etching selectivity as the sacrificial gate 1027' (e.g. SiGe having a similar or the same atomic percentage of Ge) may be deposited to increase the height of the sacrificial gate 1027'.

Next, the gate replacement process may be performed.

Figure 18:
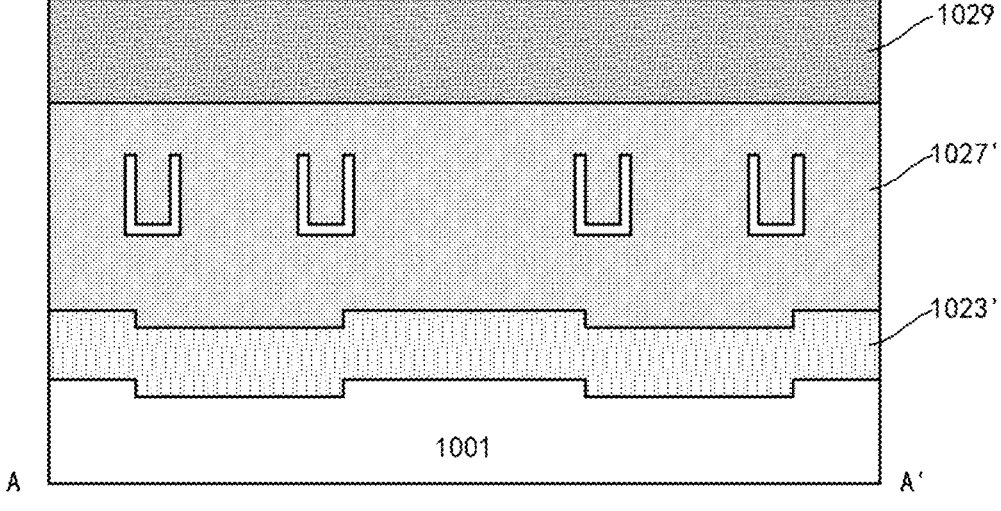
Figure 19:
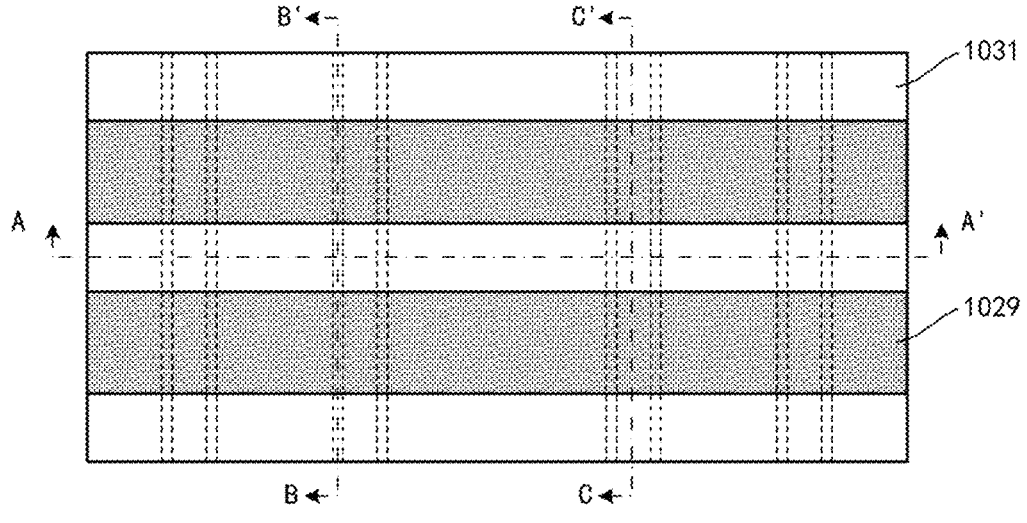
Figure 20A:
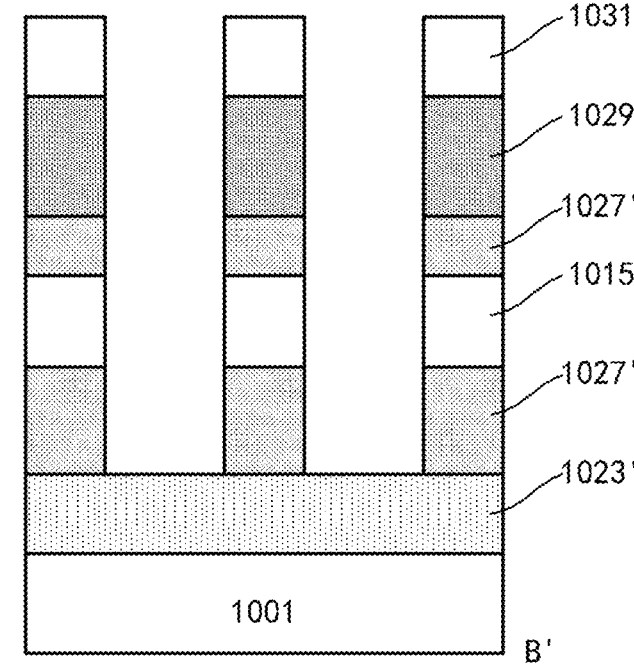
Figure 20B:
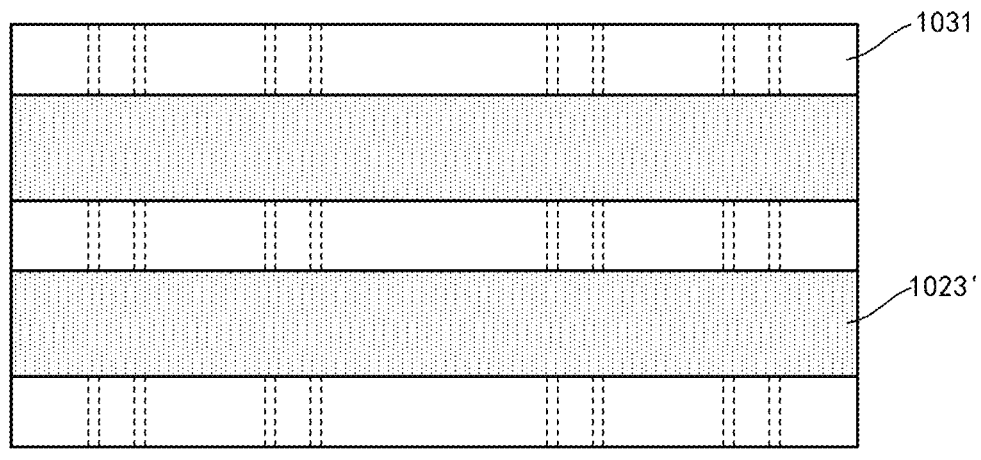

For example, as shown in FIG. 18, a hard mask layer 1029 may be formed, e.g. by deposition, on the sacrificial gate 1027' to facilitate subsequent patterning of the sacrificial gate 1027'. For example, the hard mask layer 1029 may include nitride, and the thickness thereof is, for example, about 50 nm to 150 nm. The sacrificial gate 1027' may be patterned into a shape of a stripe extending in the second direction, thereby forming the sacrificial gate. For example, as shown in FIG. 19, a photoresist 1031 may be formed on the hard mask layer 1029 and patterned into the stripe shape extending in the second direction. Then, as shown in FIGS. 20(*a*) and 20(*b*), the hard mask layer 1029, the sacrificial gate 1027', and the semiconductor layer 1015 may be sequentially selected etched through selective etching such as RIE, by using the photoresist 1031 as the mask. Thus, the sacrificial gate 1027' may be patterned into the stripe shape extending in the second direction. The etching may be stopped at the isolation layer 1023' of oxide. Afterwards, the photoresist 1031 may be removed.

Figure 21:
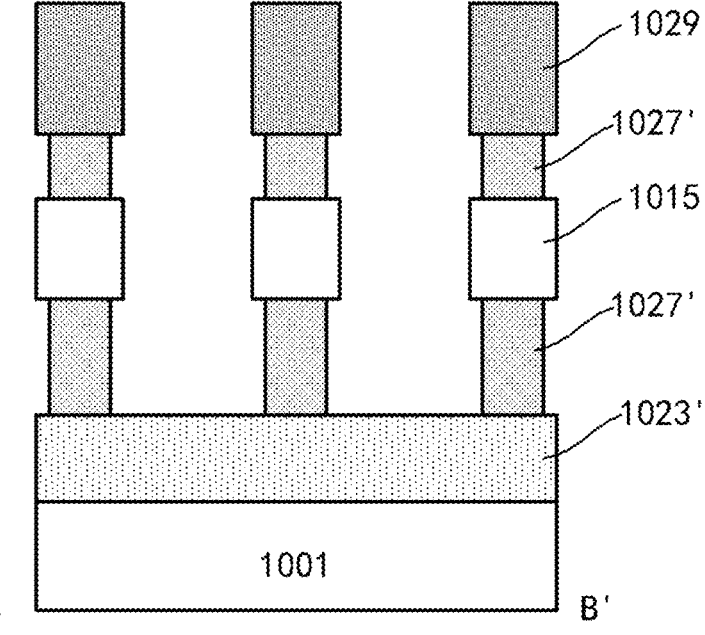
Figures 22A, 22B:
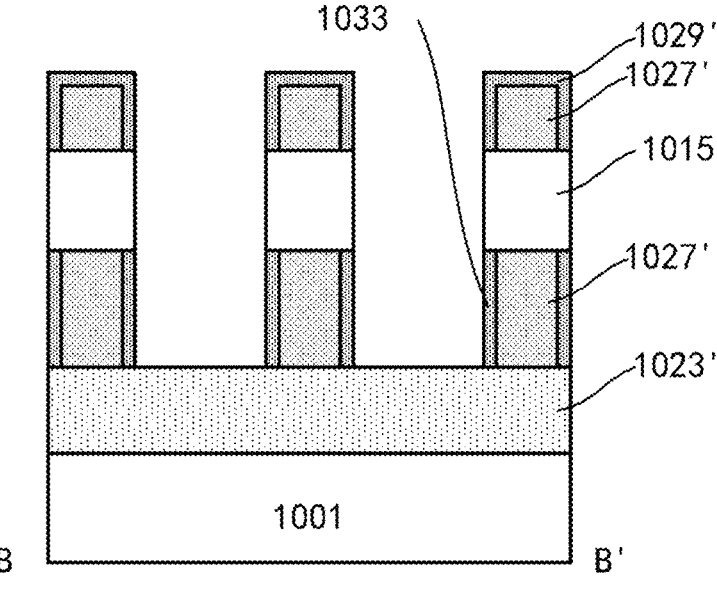

A gate spacer may be formed on a sidewall of the sacrificial gate 1027'. For example, as shown in FIG. 21, the sacrificial gate 1027' (with respect to the semiconductor layer 1015) may be recessed to a certain depth in the lateral direction by selective etching. Atomic layer etching (ALE) may be employed in order to control the recess depth. As shown in FIGS. 22(*a*) and 22(*b*), the formed recess may be filled with a dielectric material to form a gate spacer 1033. Such filling may formed, for example, by depositing nitride with a thickness of about 2 nm to 5 nm, followed by RIE of the deposited nitride (until the surface of the semiconductor layer 1015 is exposed). Here, the hard mask layer 1029, which is also nitride, and the gate spacer on the sidewalls of the sacrificial gate 1027' may become integral, and are thus labeled as 1029'.

According to such process, gate spacers 1033 may be formed on the sidewalls of the sacrificial gate 1027' in a self-aligned manner without being formed on the sidewalls of the semiconductor layer 1015. The gate spacers 1033 may have a substantially uniform thickness, depending on the depth of the aforementioned recess for example. In addition, outer sidewalls of the gate spacers 1033 may be substantially vertically aligned with outer sidewalls of the semiconductor layer 1015. Inner sidewalls of the gate spacers 1033 may be substantially aligned in the vertical direction (it is achieved by controlling the etching depth for each recess to be substantially the same when forming the recesses).

After that, source/drain portions contacting the sidewalls of the semiconductor layer 1015 may be formed on two sides of the sacrificial gate 1027'.

Figure 23:
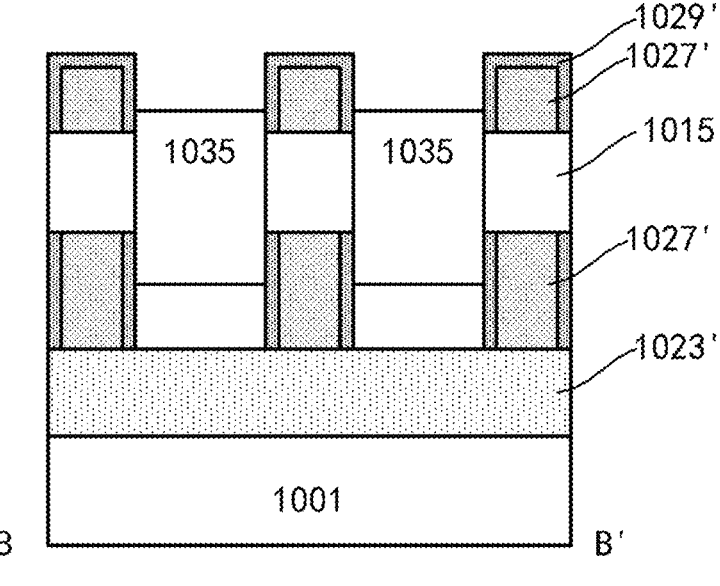

As shown in FIG. 23, source/drain portions 1035 may be formed by, for example, epitaxial growth. The source/drain portions 1035 may be grown from the exposed sidewalls of the semiconductor layer 1015. The grown source/drain portions 1035 are in contact with the sidewalls of the semiconductor layer 1015. When being grown, the source/drain portions 1035 may be in-situ doped to have a conductivity type corresponding to a device to be formed, e.g. n-type for an n-type device and p-type for a p-type device. A doping concentration may be about 1E19 $cm^{-3}$ to 1E21 $cm^{-3}$. The grown source/drain portions 1035 may have a material different from a material of the semiconductor layer 1015 (e.g. having a different lattice constant) in order to apply stress to the semiconductor layer 1015. For example, for the n-type device, the source/drain portions 1035 may include Si:C (for example, with an atomic percent of C being about 0.1% to 5%). For the p-type device, the source/drain portions 1049 may include SiGe (for example, with an atomic percent of Ge being about 20% to 75%). In a case where the n-type device and the p-type device are both formed on the substrate, such as in a case of a CMOS process, the source/drain portions of the n-type device may be grown separately from the the source/drain portions of the p-type device. When growing the source/drain portions of one type of device, a region of the other type of device may be shielded by a shielding layer such as the photoresist or the like.

Figure 24A:
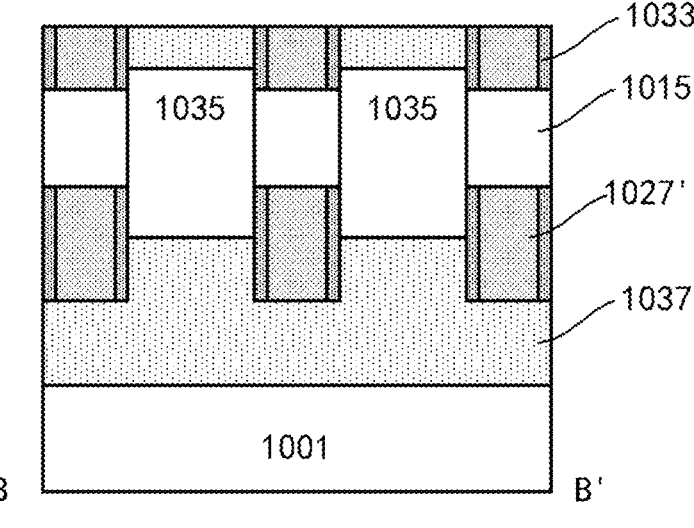
Figure 24B:
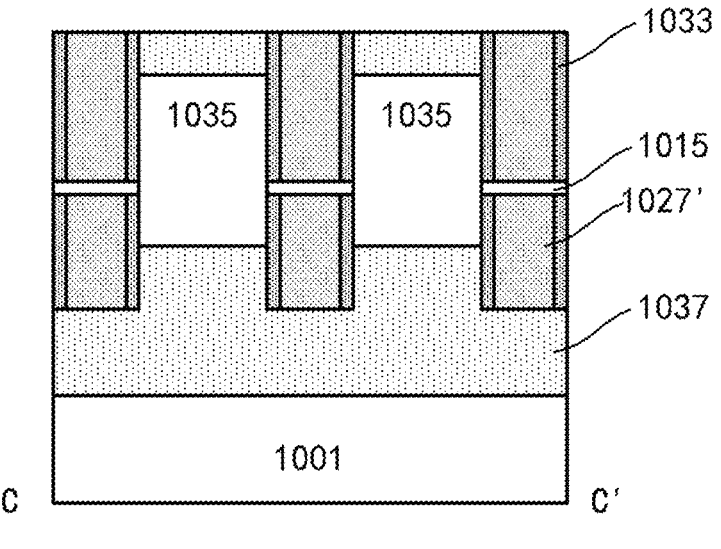

In addition to the grown source/drain portion 1035, gaps exist between the strip-shaped sacrificial gates 1027'. Such gaps may be filled with a dielectric material to form an interlayer dielectric layer. For example, as shown in FIGS. 24(*a*) and 24(*b*), the interlayer dielectric layer may be formed on the isolation layer 1023', e.g. by deposition and then planarization (until the sacrificial gate 1027' is exposed). Here, the interlayer dielectric layer may include oxide. Thus the previously formed isolation layer 1023' of oxide and the interlayer dielectric layer may be shown as integral and are collectively labeled as 1037.

Currently, opposite sides of the same source/drain portion 1035 are both connected to the semiconductor layers 1015. That is, devices on opposite sides are now electrically connected together. Depending on the design layout, the electrical isolation may be provided between the devices.

Figure 25A:
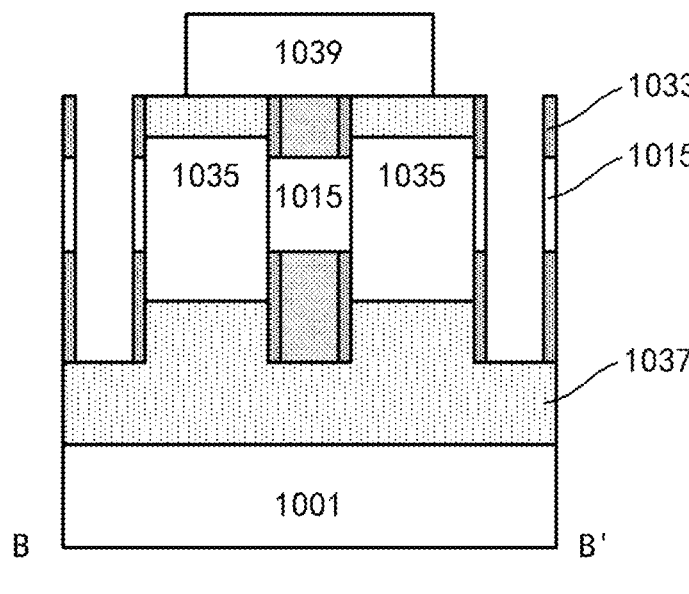
Figure 25B:
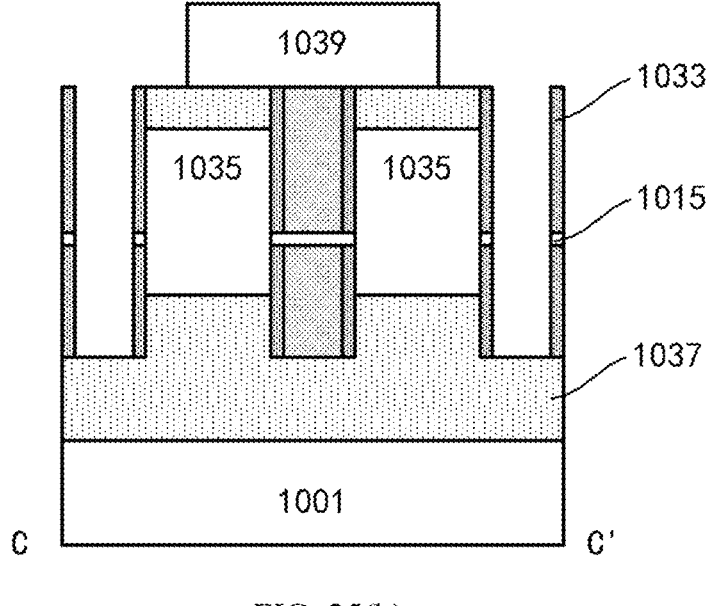
Figure 26A:
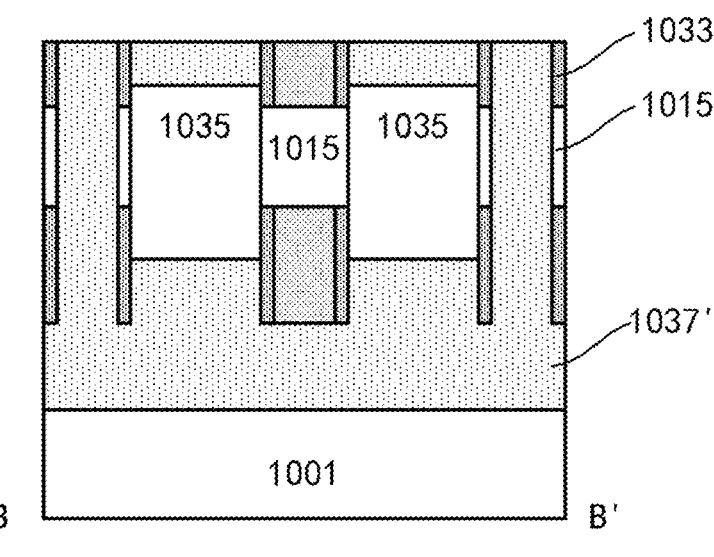
Figures 26B, 27A:
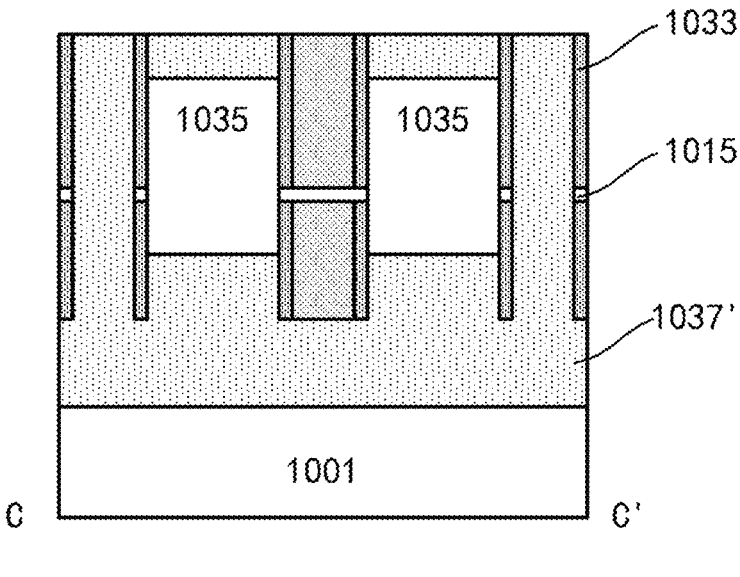

For example, as shown in FIGS. 25(*a*) and 25(*b*), a photoresist 1039 may be formed on the isolation layer 1037 and patterned to shield one or more sacrificial gates 1027' and expose other sacrificial gates 1027'. In this example, a sacrificial gate 1027' in the middle is shielded, while the sacrificial gates 1027' on two sides are exposed. Selective etching may be performed on the exposed sacrificial gates 1027' and the semiconductor layers 1015 below the exposed sacrificial gates 1027' in sequence (which may stop at the isolation layer 1037) by, for example, RIE, thereby leaving a space between the gate spacers 1033. Afterwards, the photoresist 1039 may be removed. As shown in FIGS. 26(*a*) and 26(*b*), the remaining space may be filled with the dielectric material such as oxide to form an isolation portion between the devices. Such filling may include deposition followed by planarization. The isolation portion may extend between the spacers 1033. The spacers 1033 on two sides of the isolation portion are no longer used to define the gate stack, and thus may be called as dummy gate spacers. In this example, the formed isolation portion and the previously formed isolation layer 1037 both include oxide, and thus may be shown as integral and are collectively labeled as 1037'.

It should be pointed out that whether or not to form the isolation portion and between which devices the isolation portion is to be formed depends on the circuit design.

In the following, descriptions are made by taking the cases shown in FIGS. 24(*a*) and 24(*b*) as examples, but these descriptions are also applicable to the cases shown in FIGS. 26(*a*) and 26(*b*).

Next, the sacrificial gate 1027' may be replaced with the gate stack to complete device manufacture.

Figures 27B, 28A:
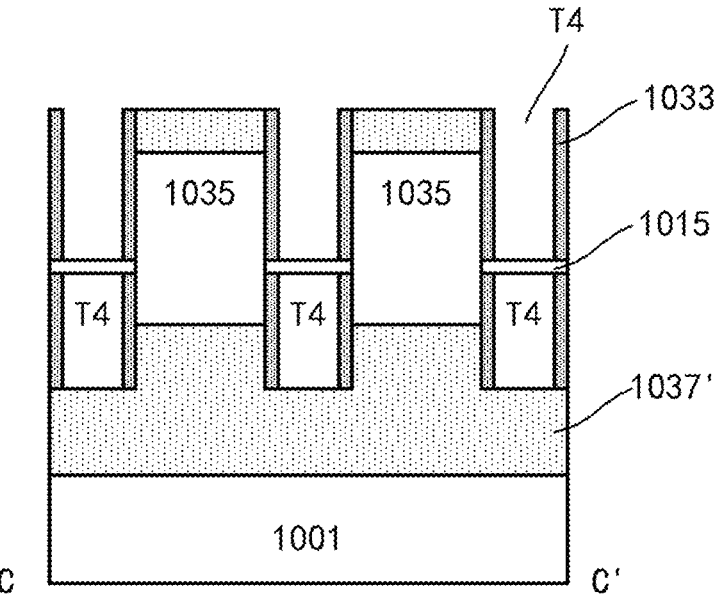
Figure 28B:
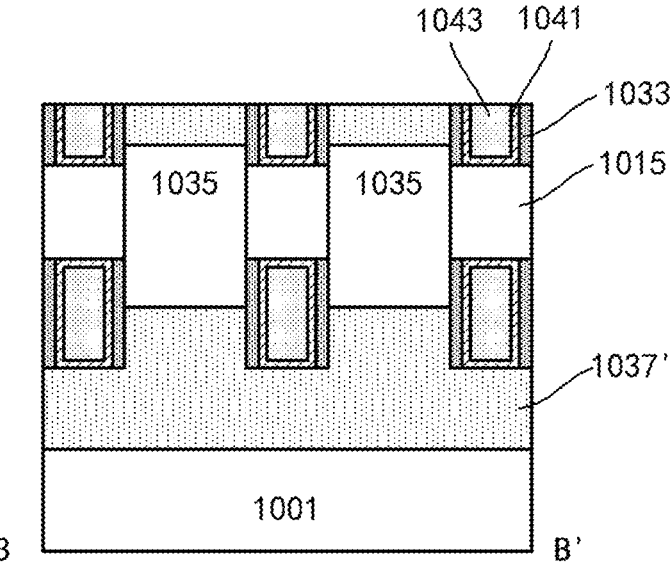
Figure 28C:
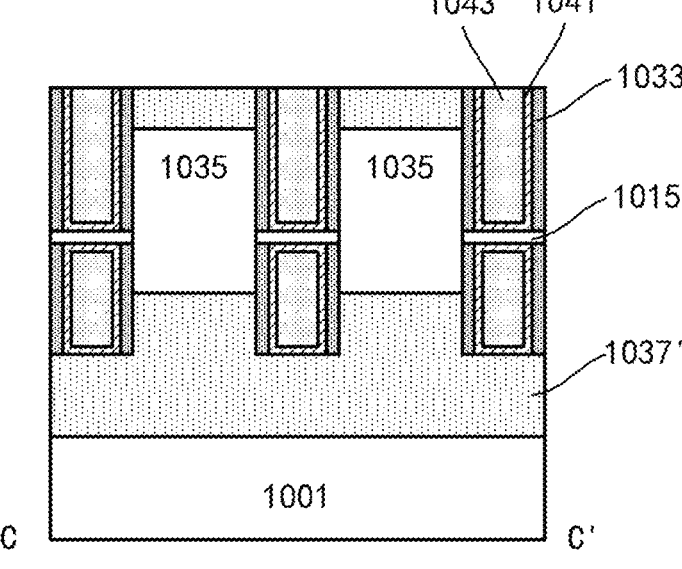
Figure 28D:
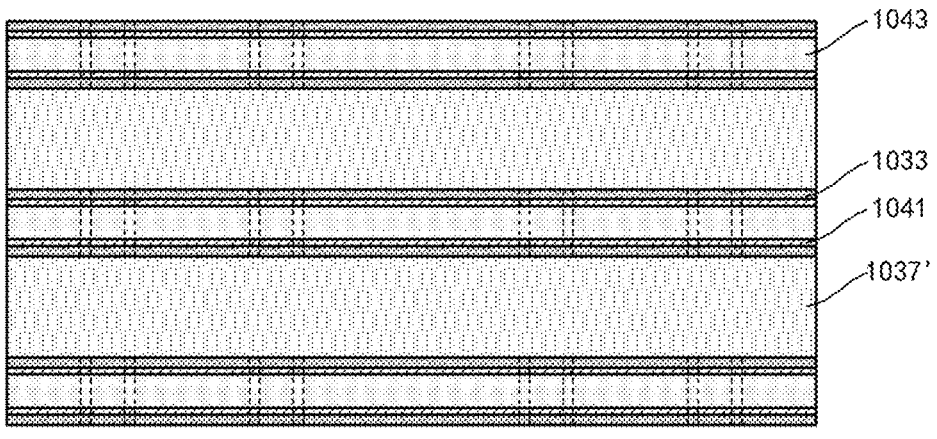

For example, as shown in FIGS. 27(*a*) and 27(*b*), the sacrificial gate 1027' may be removed by selective etching (as described above, the different portions formed in the sacrificial gate 1027', such as the above-mentioned first sacrificial layer, the second sacrificial layer and the third sacrificial layer, may include similar or the same material, and may be etched by the same etching recipe), thereby forming a gate trench T4 inside the gate spacer 1033. The gate stack may be formed in the gate trench T4. As shown in FIGS. 28(*a*), 28(*b*), 28(*c*) and 28(*d*), a gate dielectric layer 1041 and a gate conductor layer 1043 may be sequentially deposited in the gate trench T4. The gate dielectric layer 1041 may be formed in a substantially conformal manner. The gate dielectric layer 1041 may have a thickness of for example, about 2 nm to 5 nm, and may include a high-k gate dielectric such as $HfO_2$. Before forming the high-k gate dielectric, an interface layer may further be formed. For example, the interface layer may be of an oxide formed by an oxidation process or deposition such as atomic layer deposition (ALD), and have a thickness of about 0.2 nm to 2 nm. The gate conductor layer 1043 may include a work function adjusting metal such as TiN, TaN, or the like, and a gate conductive metal such as W or the like. The deposited gate dielectric layer 1041 and the gate conductor layer 1043 may be planarized for example by CMP, so as to be left within the gate trench T4.

If the p-type device and the n-type device are both formed on the substrate, different gate stacks may be formed respectively for the p-type device and the n-type device. For example, each of the gate stacks have a different work function. For example, after a first gate stack for one type of device is formed, a region of the one type of device may be shielded by the shielding layer such as the photoresist, so as to remove a first gate stack existing in a region of the other type of device (it is possible to remove only the gate conductive layer) and then form a second gate stack for the other type of device.

It can be seen that the gate stack is located at an inner side of the gate spacer 1033 and surrounds each semiconductor layer 1015. Source/drain portions 1035 are connected respectively to both sides of the semiconductor layer 1015. A channel is formed between the source/drain portions 1035, similar to a fin in the FinFET.

As described above, in the embodiments of the present disclosure, the mechanical stability may be improved, and the collapse or sticking of the fins may be prevented, which are beneficial to improve the yield. The fins are connected to each other by the connection nanosheet. The connection nanosheet also serves as the channel portion, so that a device area may be fully utilized. The semiconductor layer 1015 serving as the channel portion is formed by epitaxial growth, so its thickness may be well controlled. A different semiconductor material (e.g. different from the semiconductor material of the substrate 1001) may be used for the semiconductor layer 1015 to further improve device performance This is because the epitaxially grown semiconductor layer 1015 is thin and thus has fewer defects due to lattice mismatch.

In addition, as shown in FIG. 28(*d*), the gate stacks of current devices are continuous with each other, so that the devices have their respective gates being electrically connected to each other. Electrical isolation may be provided between the devices, depending on the design layout.

Figure 29A:
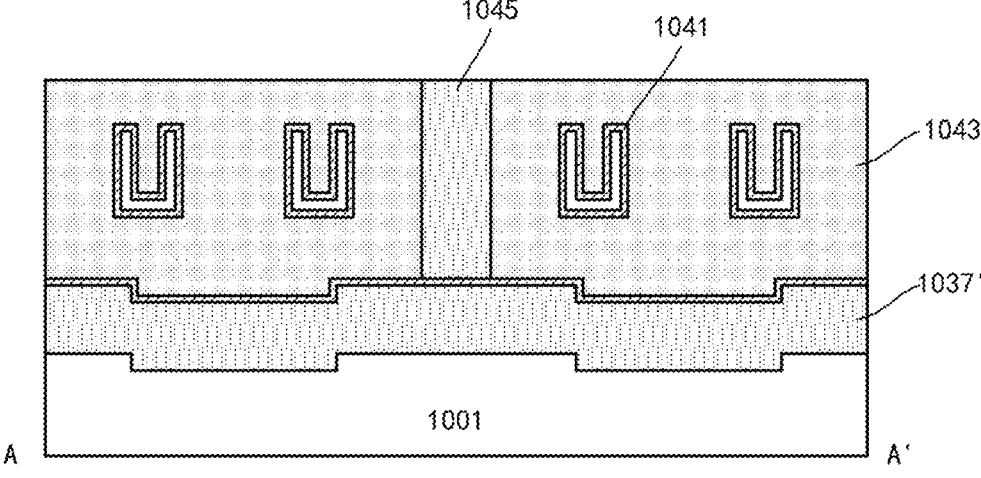
Figure 29B:
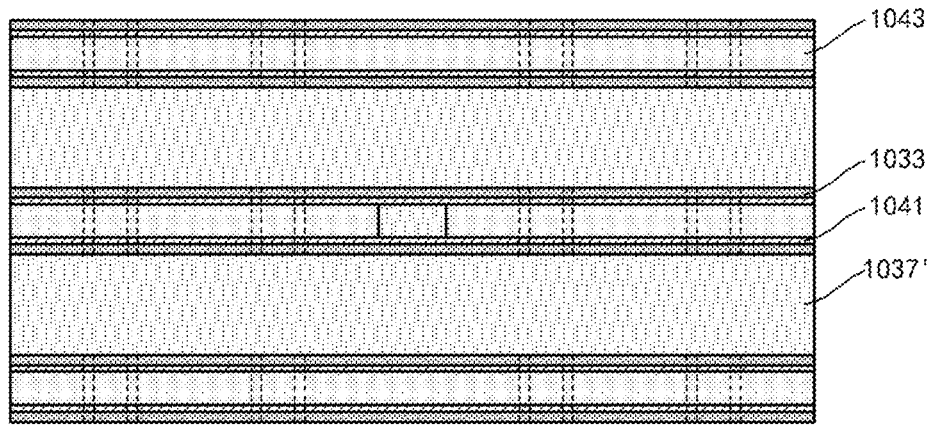

For example, as shown in FIGS. 29(*a*) and 29(*b*), the photoresist (not shown) may be formed on the isolation layer 1037' to expose a gate stack between device regions to be isolated and shield the rest of the gate stacks. After that, selective etching such as RIE may be performed on the exposed gate stack (especially the gate conductor layer therein). The etching may stop at the gate dielectric layer (or stop at the isolation layer 1037' below the gate dielectric layer). A space left by the etching of the exposed portion of the gate stack may be filled with a dielectric material 1045 such as oxide. Filling of the dielectric material 1045 may include deposition followed by planarization.

The semiconductor device according to the embodiments of the present disclosure may be applied to various electronic devices. For example, it is possible to form an integrated circuit (IC) based on such a semiconductor device, thereby constructing an electronic device. Therefore, the present disclosure also provides an electronic device including the above-mentioned semiconductor device. The electronic device may also include components such as a display screen matched with an integrated circuit and a wireless transceiver matched with an integrated circuit. Such an electronic device includes, for example, a smart phone, a computer, a tablet computer (PC), an artificial intelligence device, a wearable device, a mobile power supply, etc.

According to some embodiments of the present disclosure, a manufacturing method of a system on chip (SoC) is also provided. The method may include the method described above. Specifically, a variety of devices may be integrated on the chip, at least some of which are manufactured according to the method of the present disclosure.

In the above description, the technical details such as patterning and etching of each layer are not described in detail. However, those skilled in the art should understand that various technical means may be configured to form layers, areas, etc. of desired shapes. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A semiconductor device, comprising:
a first fin and a second fin disposed opposite to each other, wherein the first fin and the second fin extend in a vertical direction with respect to a substrate; and
a connection nanosheet connecting a bottom end of the first fin to a bottom end of a second fin to form a U-shaped structure,
wherein the connection nanosheet is spaced apart from a top surface of the substrate,
wherein the semiconductor device further comprises:
source/drain portions located on opposite sides of the U-shaped structure in a first direction on the substrate and connected to the U-shaped structure;
a gate stack extending in a second direction on the substrate and intersecting the U-shaped structure, wherein the second direction intersects the first direction; and
a gate spacer disposed on a sidewall of the gate stack, wherein the gate spacer comprises a first portion above the U-shaped structure and a second portion below the U-shaped structure.

2. The semiconductor device according to claim 1, wherein the connection nanosheet extends substantially parallel to the top surface of the substrate.

3. The semiconductor device according to claim 1, wherein the U-shaped structure extends integrally and has a substantially uniform thickness.

4. The semiconductor device according to claim 1, wherein the U-shaped structure comprises a material different from a material of the substrate.

5. The semiconductor device according to claim 1, wherein a top surface of the first fin and a top surface of the second fin are at substantially the same height with respect to the top surface of the substrate.

6. The semiconductor device according to claim 1, wherein the gate stack surrounds the U-shaped structure.

7. The semiconductor device according to claim 1, further comprising:
an isolation layer disposed between the gate stack and the substrate.

8. The semiconductor device according to claim 1, wherein a plurality of semiconductor devices are disposed on the substrate, wherein at least one pair of semiconductor devices adjacent in the first direction among the plurality of semiconductor devices have respective first fins being substantially coplanar, respective second fins being substantially coplanar, and respective connection nanosheets being substantially coplanar.

9. The semiconductor device according to claim 1, wherein a plurality of semiconductor devices are disposed on the substrate, at least one pair of semiconductor devices adjacent in the second direction among the plurality of semiconductor devices have respective gate spacers extending integrally and continuously with respect to each other.

10. The semiconductor device according to claim 1, wherein the first portion of the gate spacer and the second portion of the gate spacer have the same material and have substantially the same thickness.

11. The semiconductor device according to claim 1, wherein an inner sidewall of the first portion of the gate spacer is substantially aligned with an inner sidewall of the second portion of the gate spacer in the vertical direction.

12. The semiconductor device according to claim 1, wherein a plurality of semiconductor devices are disposed on the substrate, wherein semiconductor devices adjacent in the first direction among the plurality of semiconductor devices are electrically isolated from each other by an isolation portion, and a range of the isolation portion in the first direction is defined by a dummy gate spacer extending in the second direction.

13. The semiconductor device according to claim 12, wherein a range of a top of the source/drain portions of the semiconductor device in the first direction is defined by the gate spacer of the semiconductor device and the dummy gate spacer of the semiconductor device.

14. The semiconductor device according to claim 1, wherein a plurality of semiconductor devices are disposed on the substrate, wherein semiconductor devices adjacent in the first direction among the plurality of semiconductor devices are electrically isolated from each other by an isolation portion extending in the second direction.

15. The semiconductor device according to claim 14, wherein the source/drain portions extend in the second direction; and
wherein the semiconductor device further comprises a gate spacer disposed between the gate stack and the source/drain portions, and a dummy gate spacer disposed between the isolation portion and the source/drain portions, wherein the gate spacer and the dummy gate spacer have substantially the same thickness in the first direction.

16. The semiconductor device according to claim 15, further comprising: a U-shaped structure which is aligned with the dummy gate spacer in the vertical direction and corresponds to the U-shaped structure.

17. An electronic device comprising the semiconductor device according to claim 1.

18. A method of manufacturing a semiconductor device, comprising:
forming, in a substrate, a first trench extending in a first direction, wherein the first trench comprises sidewalls disposed opposite to each other and extending in the first direction and a bottom surface connecting the sidewalls;
forming, in the first trench, a semiconductor layer extending along the sidewalls and the bottom surface;
filling the first trench in which the semiconductor layer is formed, with a first sacrificial layer;
forming, on a first side of the first trench filled with the first sacrificial layer in a second direction intersecting the first direction, a second trench entering the substrate and extending in the first direction, wherein the second trench extends to a position below the bottom surface of the first trench in the second direction, and a connection of the semiconductor layer and the first sacrificial layer in the first trench to the substrate is maintained on a second side, which opposite to the first side in the second direction, of the first trench;

forming a second sacrificial layer in the second trench;

forming, on the second side of the first trench filled with the first sacrificial layer, a third trench entering the substrate and extending in the first direction, wherein the third trench extends to a position below the bottom surface of the first trench in the second direction to reach the second sacrificial layer; and filling the third trench with a third sacrificial layer, so that the semiconductor layer is surrounded by the first sacrificial layer, the second sacrificial layer and the third sacrificial layer, wherein the first sacrificial layer, the second sacrificial layer and the third sacrificial layer are configured to be selectively etched with respect to the semiconductor layer.

19. The method according to claim 18, wherein:

a portion of an isolation layer is formed at the bottom of the second trench before filling the second trench with the second sacrificial layer; and another portion of the isolation layer is formed at the bottom of the third trench before filling the third trench with the third sacrificial layer; and wherein the portion of the isolation layer and the another portion of the isolation layer are connected to each other, such that the isolation layer is interposed between the substrate and the second and third sacrificial layers.

20. The method according to claim 18, wherein an etching stop layer extending along the sidewalls and the bottom surface is formed in the first trench before forming the semiconductor layer.

21. The method according to claim 18, wherein filling the first trench with the first sacrificial layer comprises:

filling the first trench with a portion of the first sacrificial layer to expose a top portion of the semiconductor layer;

removing the exposed top portion of the semiconductor layer; and filling the first trench with the rest of the first sacrificial layer.

22. The method according to claim 18, wherein a part of the bottom surface of the first trench exposed from the second trench has a width in the second direction being smaller than an entire width of the bottom surface of the first trench in the second direction, and being larger than a half of the width of the bottom surface of the first trench in the second direction.

23. The method according to claim 19, further comprising:

patterning the first sacrificial layer, the second sacrificial layer and the third sacrificial layer into a strip-shaped sacrificial gate extending in the second direction;

selectively etching the semiconductor layer by using the sacrificial gate as a mask;

forming, on opposite sides of the etched semiconductor layer in the first direction, another semiconductor layer for forming source/drain portions; and replacing the sacrificial gate with a gate stack.

24. The method according to claim 23, further comprising:

selectively etching the sacrificial gate, so that a sidewall of the sacrificial gate is recessed with respect to a sidewall of the semiconductor layer in the first direction; and forming a spacer on the sidewall of the sacrificial gate.

25. The method according to claim 23, wherein a plurality of sacrificial gates arranged in the first direction are formed, and the method further comprises:

selectively etching at least one of two sacrificial gates on opposite sides of at least one sacrificial gate, and the semiconductor layer exposed therefrom to reach the isolation layer, so as to form a fourth trench; and filling the fourth trench with a dielectric material.

26. The electronic device according to claim 17, wherein the electronic device comprises a smart phone, a computer, a tablet, an artificial intelligence device, a wearable device, or a mobile power supply.

* * * * *